(12) United States Patent
Dally et al.

(10) Patent No.: US 9,251,870 B2
(45) Date of Patent: *Feb. 2, 2016

(54) GROUND-REFERENCED SINGLE-ENDED MEMORY INTERCONNECT

(71) Applicant: NVIDIA Corporation, Santa Clara, CA (US)

(72) Inventors: William J. Dally, Los Altos Hills, CA (US); John W. Poulton, Chapel, NC (US); Thomas Hastings Greer, III, Chapel Hill, NC (US); Brucek Kurdo Khailany, San Francisco, CA (US); Carl Thomas Gray, Apex, NC (US)

(73) Assignee: NVIDIA Corporation, Santa Clara, CA (US)

( * ) Notice: Subject to any disclaimer, the term of this patent is extended or adjusted under 35 U.S.C. 154(b) by 103 days.

This patent is subject to a terminal disclaimer.

(21) Appl. No.: 13/857,099

(22) Filed: Apr. 4, 2013

(65) Prior Publication Data

US 2014/0301134 A1  Oct. 9, 2014

(51) Int. Cl.
| | |
|---|---|
| *G11C 11/40* | (2006.01) |
| *G11C 7/00* | (2006.01) |
| *G11C 11/41* | (2006.01) |
| *G11C 7/10* | (2006.01) |
| *G11C 11/4096* | (2006.01) |

(52) U.S. Cl.
CPC .............. *G11C 7/00* (2013.01); *G11C 7/1057* (2013.01); *G11C 7/1069* (2013.01); *G11C 11/4096* (2013.01); *G11C 11/41* (2013.01)

(58) Field of Classification Search
CPC ........................................................ G11C 11/00
USPC ..................................................... 365/189.18
See application file for complete search history.

(56) References Cited

U.S. PATENT DOCUMENTS

| | | | | |
|---|---|---|---|---|
| 2003/0208668 | A1* | 11/2003 | To et al. ..................... | 711/200 |
| 2008/0219037 | A1* | 9/2008 | Janssen ......................... | 365/63 |
| 2008/0301256 | A1* | 12/2008 | McWilliams et al. ........ | 709/214 |
| 2009/0031078 | A1* | 1/2009 | Warnes et al. ................ | 711/105 |

(Continued)

OTHER PUBLICATIONS

Poulton, J. W. et al., "A 0.54pJ/b 20Gb/s Ground-Referenced Single-Ended Short-Haul Serial Link in 28nm CMOS for Advanced Packaging Applications," 2013 IEEE International Solid-State Circuits Conference, ISSCC 2013 / Session 23 / Short-Reach Links, XCVR Techniques, & PLLS 123.3, Feb. 20, 2013, pp. 404-405.

(Continued)

*Primary Examiner* — Min Huang
(74) *Attorney, Agent, or Firm* — Zilka-Kotab, PC

(57) ABSTRACT

A system is provided for transmitting signals. The system comprises a first processing unit, a cache memory, and a package. The first processing unit comprises a first ground-referenced single-ended signaling (GRS) interface circuit and the second processing unit comprises a second GRS interface circuit. The cache memory comprises a third and a fourth GRS interface circuit. The package comprises one or more electrical traces that couple the first GRS interface to the third GRS interface and couple the second GRS interface to the fourth GRS interface, where the first GRS interface circuit, the second GRS interface, the third GRS interface, and the fourth GRS interface circuit are each configured to transmit a pulse along one trace of the one or more electrical traces by discharging a capacitor between the one trace and a ground network.

19 Claims, 18 Drawing Sheets

(56) References Cited

U.S. PATENT DOCUMENTS

| | | | |
|---|---|---|---|
| 2009/0080280 A1* | 3/2009 | Boucard et al. | 365/230.03 |
| 2010/0091537 A1* | 4/2010 | Best et al. | 365/51 |
| 2010/0182848 A1* | 7/2010 | Hotta et al. | 365/189.05 |
| 2010/0202202 A1* | 8/2010 | Roohparvar | 365/185.08 |
| 2011/0233741 A1* | 9/2011 | Ishii et al. | 257/668 |
| 2011/0309475 A1* | 12/2011 | Lee | 257/532 |
| 2012/0089796 A1* | 4/2012 | Fukazawa et al. | 711/162 |

OTHER PUBLICATIONS

Dally, W. J. et al., U.S. Appl. No. 13/844,570, filed Mar. 15, 2013.

Office Action from Taiwan Application No. 103112097, dated Jun. 25, 2015.

* cited by examiner

GROUND-REFERENCED SINGLE-ENDED MEMORY INTERCONNECT

FIELD OF THE INVENTION

The present invention relates to digital signaling, and more specifically to ground-referenced single-ended signaling.

BACKGROUND

Sequential generations of computing systems typically require higher performance and, in many cases, reduced size and reduced overall power consumption. A typical computing system includes a central processing unit, a graphics processing unit, and a high-capacity memory subsystem, such as one or more dynamic random access memory (DRAM) devices. To achieve a high level of integration and miniaturization, conventional computing systems integrate one or more general-purpose central processing unit (CPU) cores and one or more graphics processing unit (GPU) cores on a single processor system chip that is coupled to one or more DRAM chips. One or more hierarchical tiers of high-speed cache memory are typically implemented to reduce relatively long average latencies associated with accessing data stored in DRAM. A first level cache is typically disposed in close physical proximity to each core within the processor system chip to provide relatively fast access to cached data. Additional cache memory levels may be integrated in the processor system chip, at increasing physical distance from each core to provide larger, but typically slightly slower cache memory pools between each first level cache and DRAM.

Conventional on-chip interconnect signaling is characterized as having relatively slow propagation velocity, even at higher metal levels. The relatively slow propagation velocity becomes increasingly significant for longer on-chip traces required to interconnect processor cores to cache memories. As a consequence, increasing physical distance between the cache memories and related processor cores also increases access latency, which can lead to an overall reduction in system performance.

Thus, there is a need for improving signaling and/or other issues associated with the prior art.

SUMMARY

A system is provided for transmitting signals. The system comprises a first processing unit, a cache memory, and a package. The first processing unit comprises a first ground-referenced single-ended signaling (GRS) interface circuit and the second processing unit comprises a second GRS interface circuit. The cache memory comprises a third and a fourth GRS interface circuit. The package comprises one or more electrical traces that couple the first GRS interface to the third GRS interface and couple the second GRS interface to the fourth GRS interface, where the first GRS interface circuit, the second GRS interface, the third GRS interface, and the fourth GRS interface circuit are each configured to transmit a pulse along one trace of the one or more electrical traces by discharging a capacitor between the one trace and a ground network.

DETAILED DESCRIPTION

A technique is provided for high-speed, single-ended signaling between a processor and memory devices. A ground-referenced driver transmits a pulse having a polarity determined by a corresponding logic state. The pulse traverses a signal path and is received by a ground-referenced amplifier, which amplifies the pulse for interpretation as a conventional logic signal. A set of ground-referenced drivers and ground-referenced amplifiers implement a high-speed interface within the processor and a corresponding interface within one or more memory devices coupled to the processor. The high-speed interface advantageously improves memory bandwidth within the processor, enabling higher performance and higher density systems than provided by conventional memory signaling techniques.

Embodiments of the present invention implement a system comprising a processor chip and one or more memory chips coupled to a multi-chip package. Interconnections between the processor chip and the one or more memory chips are routed through the multi-chip package. At least one of the interconnections is configured to implement a ground-referenced single-ended signaling (GRS) link.

A GRS link implements a charge pump driver configured to transmit a ground-referenced pulse on an associated signal line. In one implementation, a pulse of positive charge indicates a logical one, while a pulse of negative charge indicates a logical zero. The charge pump driver eliminates simultaneous switching noise (SSN) commonly associated with single-ended signaling by forcing transient signal current and ground current to be locally balanced, and by drawing a constant amount of charge from the power supply each half clock cycle, independent of the data being transmitted. The pulse is received and amplified by a common gate amplifier stage configured to use a local ground signal as an input reference. This configuration provides substantial immunity to common mode noise, the dominant source of transmission errors in single-ended signaling. A second amplifier stage translates a given received pulse to full-swing logic voltages, allowing the received pulse to be properly interpreted as one or two logic states by conventional logic circuitry. In one embodiment, a GRS receiver comprises a common gate amplifier stage, the second amplifier stage, and two storage elements, such as flip-flips, configured to capture received data during alternate clock phases.

A GRS transceiver includes a GRS driver and a GRS receiver. The GRS transceiver transmits outbound data through the GRS driver and receives inbound data through the GRS receiver. An isochronous GRS transceiver may also transmit clocking information having a fixed phase relationship to the outbound data and receives clocking information having a fixed phase relationship to the inbound data.

Figure 1A:
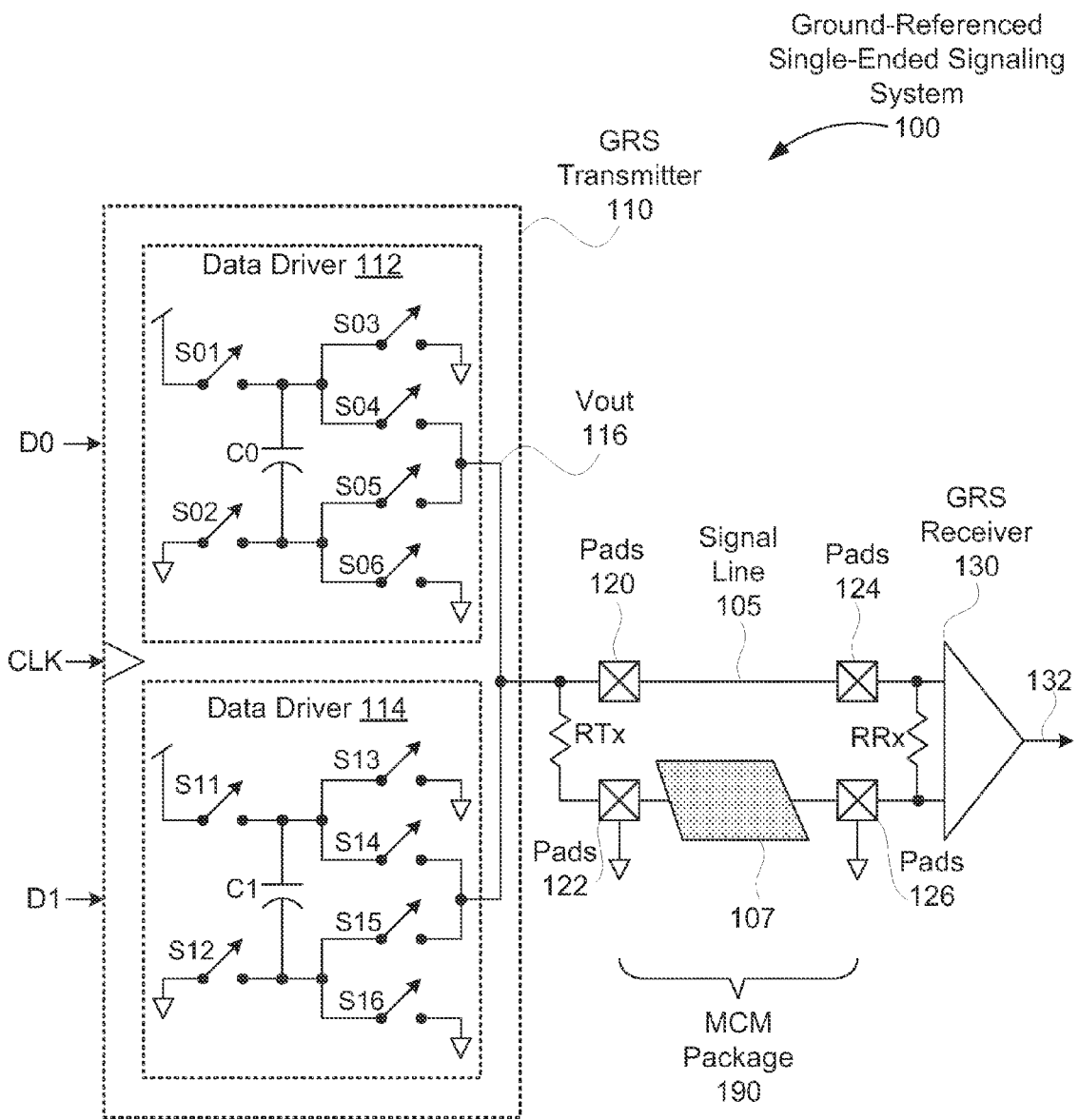
FIG. 1A illustrates a ground-referenced single-ended signaling (GRS) system that implements a GRS transmitter based on a flying capacitor charge pump, in accordance with one embodiment.

FIG. 1A illustrates a ground-referenced single-ended signaling (GRS) system 100 that implements a GRS transmitter 110 based on a flying capacitor charge pump, in accordance with one embodiment. GRS system 100 includes GRS transmitter 110, a transmission path comprising a signal line 105 and a ground network 107, and a GRS receiver 130. In one embodiment, GRS transmitter 110 comprises two data drivers 112, 114. Input data signals D0 and D1 are presented to GRS transmitter 110 based on a clock signal CLK. Data driver 112 is configured to capture a logic state associated with input D0 and drive output signal Vout 116 onto signal line 105 with a pulse corresponding to the logic state of input D0 while CLK is low. Similarly, data driver 114 is configured to capture a logic state associated with input D1 and drive output signal Vout 116 onto signal line 105 with a pulse corresponding to the logic state of D1 while CLK is high. A sequence of pulses is formed along signal line 105 corresponding to a sequence of input data from inputs D0 and D1. The sequence of pulses is referenced to ground with a voltage swing that may be lower than conventional logic voltage swings. GRS receiver 130 is configured to amplify an incoming sequence of pulses from signal line 105 and translate the pulses to a conventional logic voltage swing so the pulses may be properly interpreted as logic signals on amplifier output signal 132. For example, the sequence of pulses along signal line 105 may have a nominal amplitude of plus or minus one-hundred millivolts, while amplifier output signal 132 may have a corresponding voltage swing of twelve hundred millivolts to zero volts with respect to ground if logic coupled to amplifier output signal 132 operates on a twelve hundred millivolt positive supply rail.

In one embodiment, GRS transmitter 110 is fabricated on a transmitter chip and GRS receiver 130 is fabricated on a receiver chip distinct from the transmitter chip. Pads 120 comprise bonding pads configured to couple output signal Vout 116 from the transmitter chip to signal line 105, which is fabricated as an impedance-controlled trace within a multi-chip module (MCM) package 190. Pads 122 comprise bonding pads configured to couple a local ground signal within the transmitter chip to ground network 107, fabricated within MCM package 190. Similarly, pads 124 comprise bonding pads configured to couple signal line 105 to an input signal for GRS receiver 130 within the receiver chip, and pads 126 comprise bonding pads configured to couple ground network 107 to a local ground within the receiver chip. A termination resistor RTx is coupled between output signal Vout 116 and the local ground within the transmitter chip to absorb incoming signals, such as reflections or induced noise signals. A termination resistor RRx is coupled across inputs to GRS receiver 130 to similarly absorb incoming signals at the receiver chip.

Data driver 112 comprises capacitor C0, and switches S01 through S06. Switch S01 enables a first node of capacitor C0 to be coupled to a positive supply rail, while switch S02 enables a second node of capacitor C0 to be coupled to a local ground net. Switches S01 and S02 are active (closed) during a pre-charge state for data driver 112, defined when CLK is equal to a logical "1" value. Switch S03 enables the first node of capacitor C0 to be coupled to GND, while switch S06 enables the second node of capacitor C0 to be coupled to GND. Switch S04 enables the first node of capacitor C0 to be coupled to Vout 116, while switch S05 enables the second node of capacitor C0 to be coupled to Vout 116. When CLK is equal to a logical "0" value, switches S04 and S06 are active when data driver 112 is driving a logical "1" value to Vout 116, or switches S03 and S05 are active when data driver 112 is driving a logical "0" value to Vout 116. Data driver 114 comprises a substantially identical circuit topology, with an inverted sense for CLK, so that data driver 114 is in a pre-charge state when CLK is equal to a logical "0" value and driving Vout 116 when CLK is equal to a logical "1" value.

In one embodiment, switches S01 through S06 and switches S11 through S16 are fabricated using monolithic complementary metal-oxide semiconductor (CMOS) devices, such as enhancement mode n-channel and p-channel field-effect transistors. Any technically feasible logic circuit topologies may be implemented to drive switches S01-S06 and switches S11-S16 into individually active or inactive states without departing the scope and spirit of embodiments of the present invention.

Figure 1B:
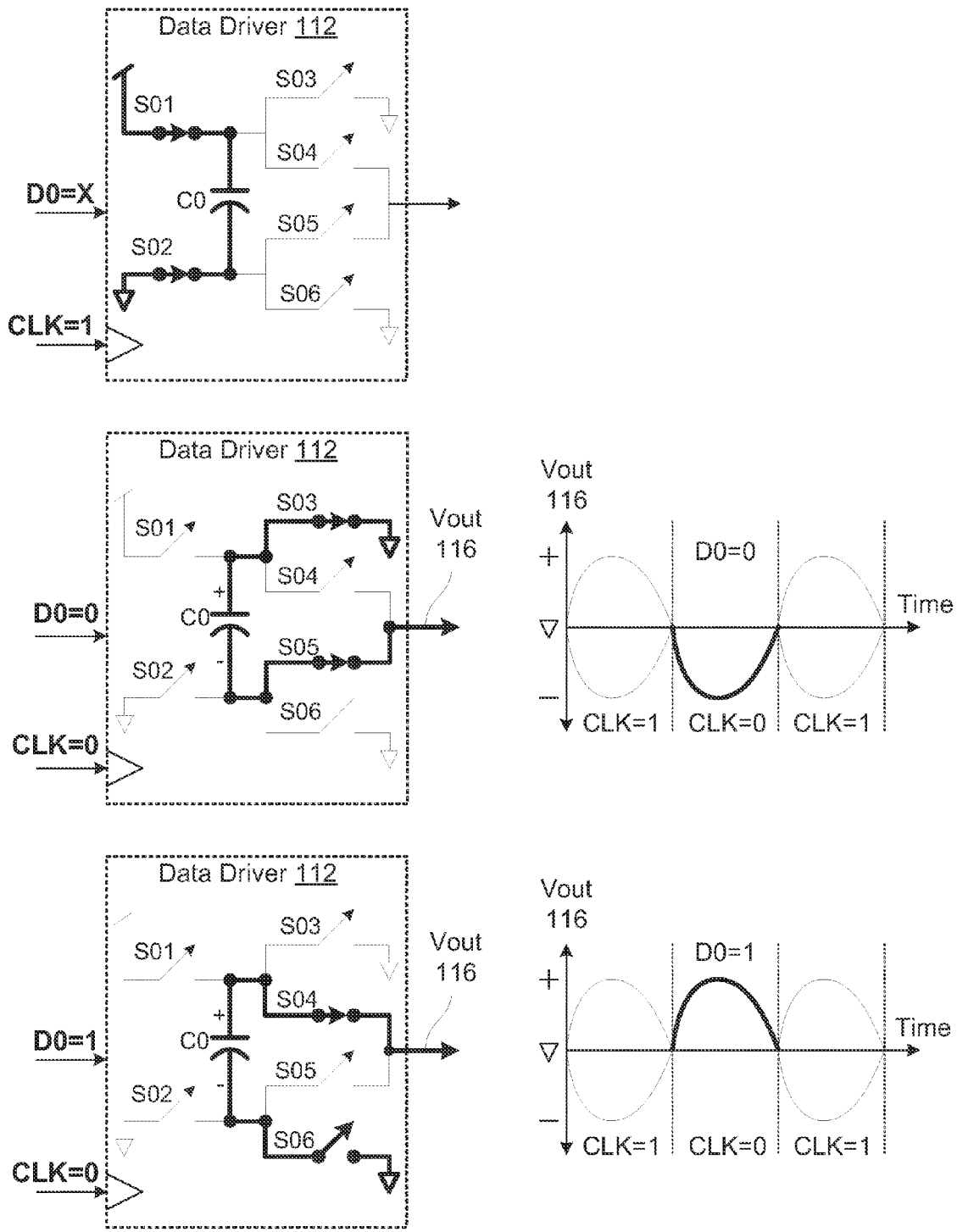
FIG. 1B illustrates operation of a data driver in a pre-charge state and in two different data-dependent drive states, in accordance with one embodiment.

FIG. 1B illustrates operation of a data driver 112 in a pre-charge state and in two different data-dependent drive states, in accordance with one embodiment. As shown, when CLK is equal to a logical "1" value, data driver 112 is in a pre-charge state, whereby switches S01 and S02 are active and capacitor C0 charges to a voltage corresponding approximately to a positive supply rail, such as a "VDD" supply rail. All of switches S03-S06 are inactive (open) during the pre-charge state. When CLK is equal to a logical "0" value, two of switches S03-S06 are configured to couple capacitor C0 to Vout 116 to transmit a pulse having a polarity corresponding to a logical value for D0. To drive a logical "0" value, switches S03 and S05 are driven active, thereby coupling a negative charge relative to ground onto Vout 116. To drive a logical "1" value, switches S04 and S06 are driven active, thereby coupling a positive charge relative to ground onto Vout 116.

Figure 1C:
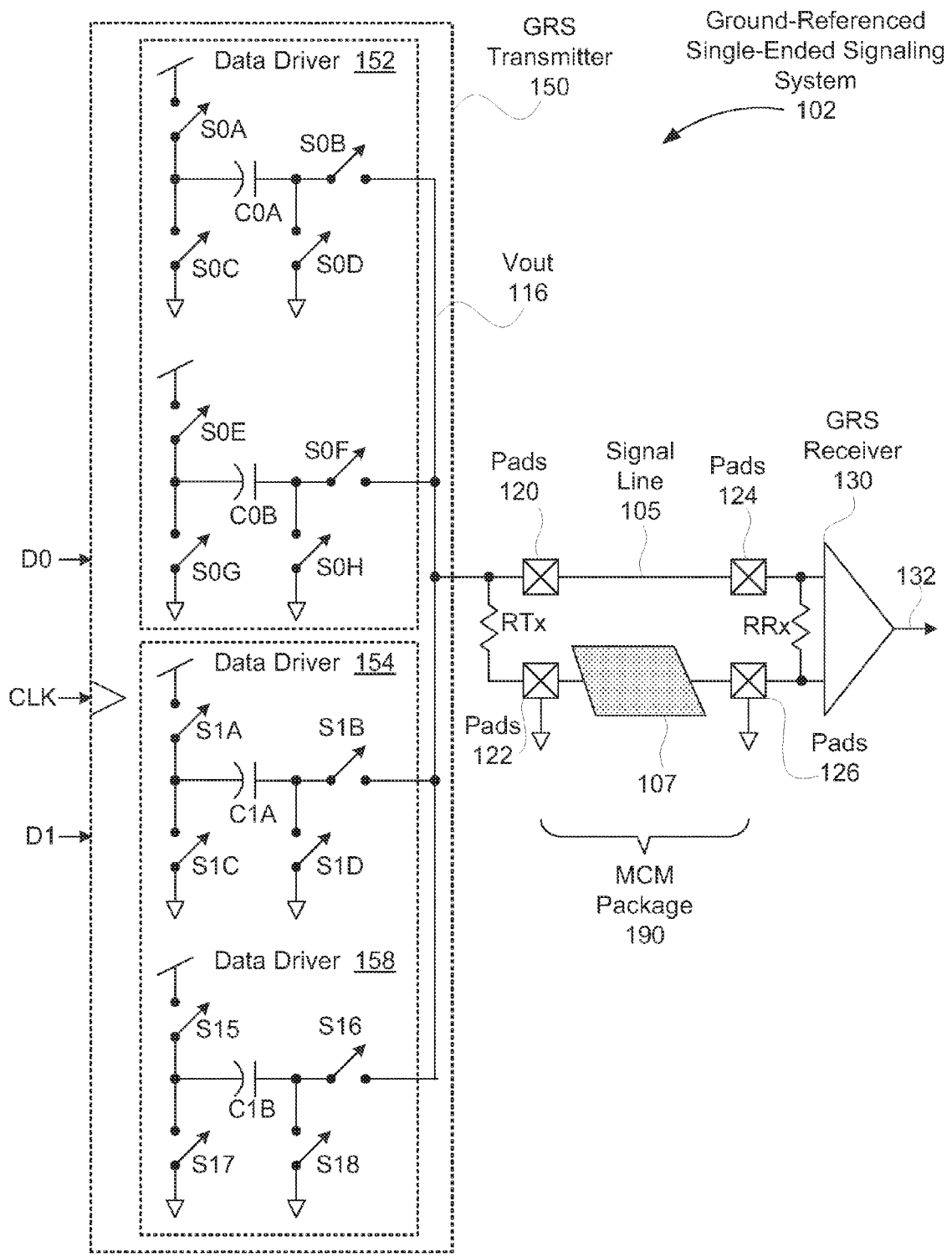
FIG. 1C illustrates a GRS system that implements a GRS transmitter based on a dual-capacitor charge pump, in accordance with one embodiment.

FIG. 1C illustrates a GRS system 102 that implements a GRS transmitter 150 based on a dual-capacitor charge pump, in accordance with one embodiment. GRS system 102 includes GRS transmitter 150, a transmission path comprising a signal line 105 and a ground network 107, and a GRS receiver 130. In one embodiment, GRS transmitter 150 comprises two data drivers 152 and 154. Operation of GRS system 102 is substantially identical to the operation of GRS system 100 described above in FIGS. 1A and 1B, with the exception of the internal topology and operation of data drivers 152 and 154.

Data driver 152 comprises capacitors C0A and C0B, as well as switches S0A through S0H. Switch S0A enables a first node of capacitor C0A to be coupled to a positive supply rail, while switch S0C enables the first node to be coupled to a local ground net. Switch S0B enables a second node of capacitor C0A to be coupled to Vout 116, while switch S0D enables the second node to be coupled to the local ground net. Similarly, switch S0E enables a first node of capacitor C0B to be coupled to the positive supply rail, while switch S0G enables the first node to be coupled to the local ground net. Switch S0F enables a second node of capacitor C0B to be coupled to Vout 116, while switch S0H enables the second node to be coupled to the local ground net.

A pre-charge state for data driver 152 is defined when CLK is equal to a logical "1" value. During the pre-charge state, switches S0A, S0D, S0G, and S0H are driven active, pre-charging capacitor C0A to a voltage corresponding to the positive supply rail relative to the local ground net, and pre-charging capacitor C0B to have approximately no charge. When CLK is equal to a logical "0" value, either capacitor C0A is coupled to Vout 116 to generate a negative pulse or capacitor C0B is coupled to Vout 116 to generate a positive pulse, as described below in conjunction with FIG. 1E. Data driver 154 comprises a substantially identical circuit topology, with an inverted sense for CLK, so that data driver 154 is in a pre-charge state when CLK is equal to a logical "0" value and driving Vout 116 when CLK is equal to a logical "1" value.

In one embodiment, switches S0A through S0H and switches S1A through S1H are fabricated using monolithic CMOS devices, such as enhancement mode n-channel and p-channel FETs. Any technically feasible logic circuit topologies may be implemented to drive switches S0A-S0H and switches S1A-S1H into individually active or inactive states without departing the scope and spirit of embodiments of the present invention.

Figure 1D:
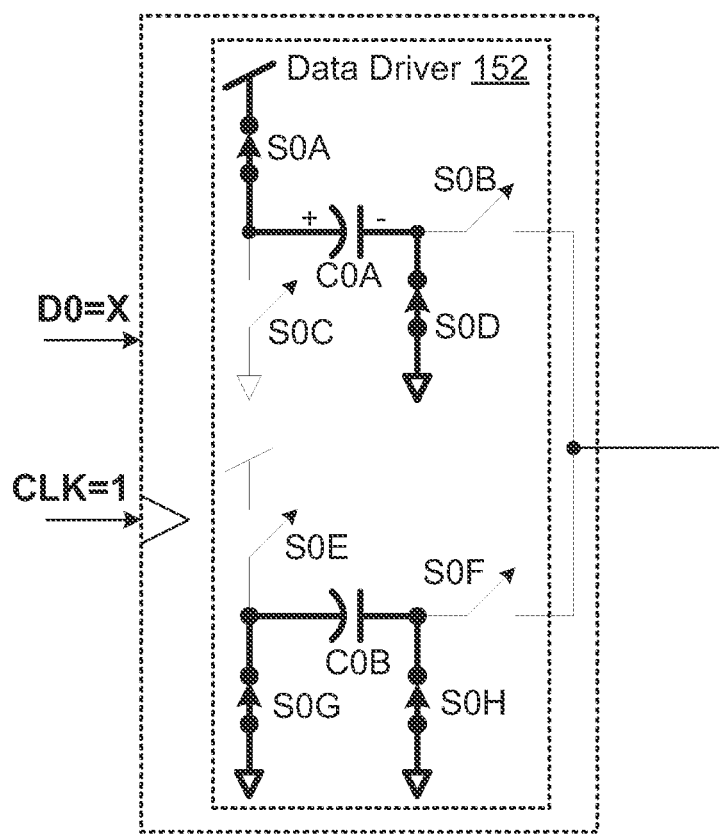
FIG. 1D illustrates operation of a data driver in a pre-charge state, in accordance with one embodiment.

FIG. 1D illustrates operation of data driver 152 in a pre-charge state, in accordance with one embodiment. As shown, when CLK is equal to a logical "1" value, switch S0A is active, coupling a first node of capacitor C0A to a positive supply rail, and switch S0D is active, coupling a second node of capacitor C0A to a local ground net. At the same time, switch S0G is active, coupling a first node of capacitor C0B to ground, and switch S0H is active, coupling a second node of capacitor C0B to ground. By the end of this pre-charge state, capacitor C0B is substantially discharged.

Figure 1E:
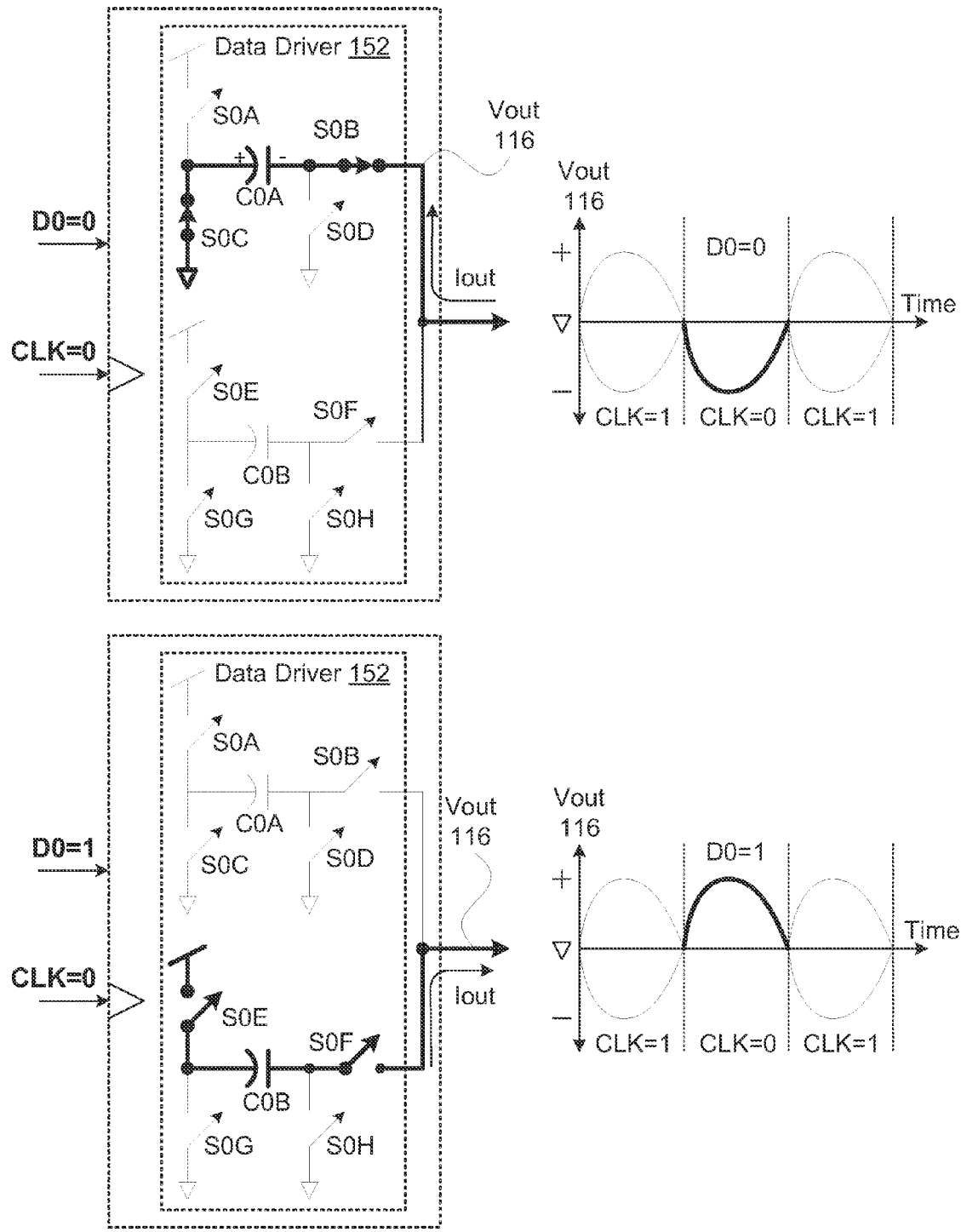
FIG. 1E illustrates operation of a data driver in different data-dependent drive states, in accordance with one embodiment.

FIG. 1E illustrates operation of data driver 152 in different data-dependent drive states, in accordance with one embodiment. As shown, when CLK is equal to a logical "0" value and D0 is equal to a logical "0" value, switches S0C and S0B are configured to couple capacitor C0A to Vout 116 to transmit a pulse having a negative polarity. Alternatively, when CLK is equal to a logical "0" value and D0 is equal to a logical "1" value, switches S0E and S0F are configured to couple capacitor C0B to Vout 116 to transmit a pulse having a positive polarity. Here, the positive supply rail is assumed to have adequate high-frequency capacitive coupling to the local ground net to force transient return current through the local ground net in conjunction with driving Vout 116 with a positive pulse.

More illustrative information will now be set forth regarding various optional architectures and features with which the foregoing framework may or may not be implemented, per the desires of a designer or user. It should be strongly noted that the following information is set forth for illustrative purposes and should not be construed as limiting in any manner. Any of the following features may be optionally incorporated with or without the exclusion of other features described.

Figure 1F:
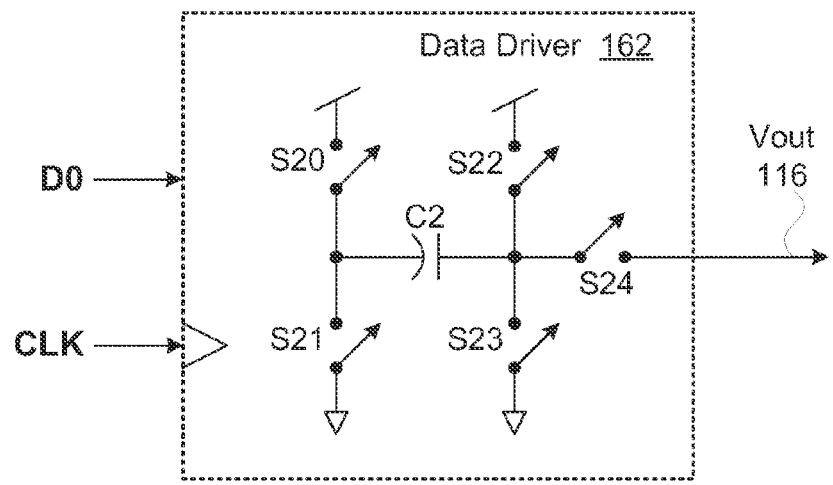
FIG. 1F illustrates operation of a ground-referenced single-ended data driver based on a flying capacitor charge pump, in accordance with one embodiment.

FIG. 1F illustrates operation of a ground-referenced single-ended data driver 162 based on a flying capacitor charge pump, in accordance with one embodiment. One or more instances of data driver 162 may be configured to operate as data drivers within a GRS transmitter. For example, an instance of data driver 162 may be configured to operate in place of data driver 112 within GRS transmitter 110 of FIG. 1A. Similarly, an instance of data driver 162 may be configured to operate in place of data driver 114.

Data driver 162 includes capacitor C2, and switches S20, S21, S22, S23, and S24, configured to pre-charge capacitor C2 during a pre-charge phase, and discharge capacitor C2 into Vout 116 during a data output phase. In one embodiment, a first instance of data driver 162 is configured to operate in a pre-charge phase when a clock signal is in a logical "0" state and a data output phase when the clock signal is in a logical "1" state. A second instance of data driver 162 is configured to operate in a pre-charge phase when the clock signal is in a logical "1" state and a data output phase when the clock signal is in a logical "0" state.

When each instance of data driver 162 is in the pre-charge phase, if D0 is in a logical "1" state, then switches S22 and S21 are active, while switches S20, S23, and S24 are inactive. While in the pre-charge phase, if D0 is in a logical "0" state, then switches S20 and S23 are active, while switches S21, S22, and S24 are inactive. During a data output phase, switches S21 and S24 are active, while switches S20, S22, and S23 are inactive. In sum, flying capacitor C2 is pre-charged with either a positive or negative polarity charge during the pre-charge phase. The charge is then discharged through ground and Vout 116 during the data output phase.

Figure 1G:
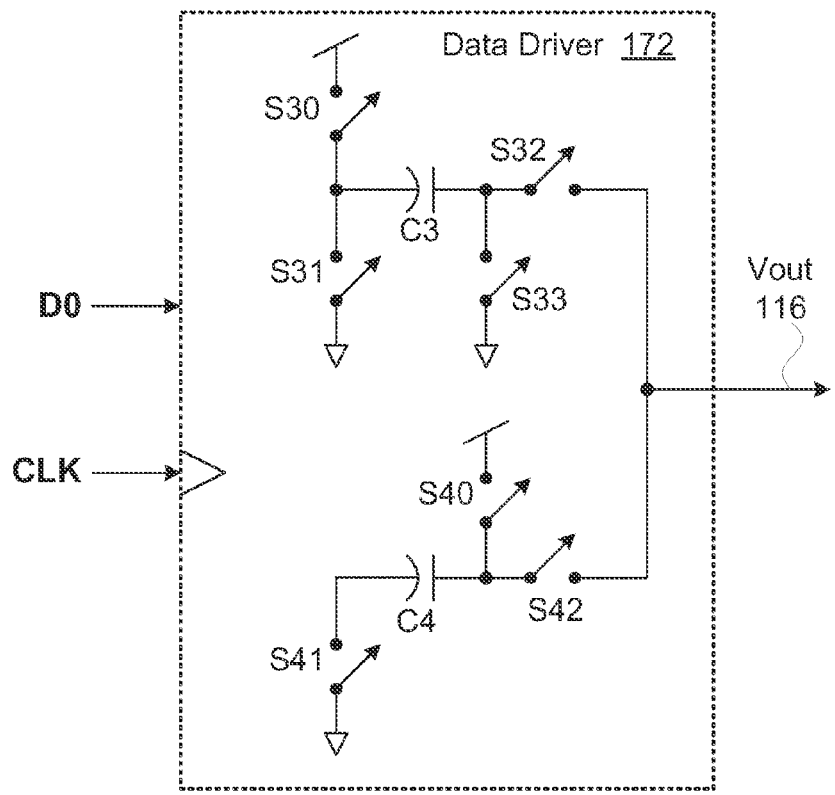
FIG. 1G illustrates operation of a ground-referenced single-ended data driver based on a dual capacitor charge pump, in accordance with one embodiment.

FIG. 1G illustrates operation of a ground-referenced single-ended data driver 172 based on a dual capacitor charge pump, in accordance with one embodiment. One or more instances of data driver 172 may be configured to operate as data drivers within a GRS transmitter. For example, an instance of data driver 172 may be configured to operate in place of data driver 112 within GRS transmitter 110 of FIG. 1A. Similarly, an instance of data driver 162 may be configured to operate in place of data driver 114.

Data driver 172 includes capacitors C3, C4, and switches S30, S31, S32, S33, S40, S41, and S42, configured to pre-charge capacitors C3 and C4 during a pre-charge phase, and discharge one of capacitors C3, C4 into Vout 116 during a data output phase. In one embodiment, a first instance of data driver 172 is configured to operate in a pre-charge phase when a clock signal is in a logical "0" state and a data output phase when the clock signal is in a logical "1" state. A second instance of data driver 172 is configured to operate in a pre-charge phase when the clock signal is in a logical "1" state and a data output phase when the clock signal is in a logical "0" state.

When each instance of data driver 172 is in the pre-charge phase, switches S30, S33, S40, and S41 are active, and switches S31, S32, and S42 are inactive. During the data output phase, if D0 is in a logical "0" state, then switches S31 and S32 are active, allowing capacitor C3 to discharge a negative polarity charge into Vout 116. At the same time, switches S30, S33, and S40-S42 are inactive. During the data output phase, if D0 is in a logical "1" state, then switches S41 and S42 are active, allowing capacitor C4 to discharge a positive polarity charge into Vout 116. At the same time, switches S40 and S30-S33 are inactive.

Figure 2A:
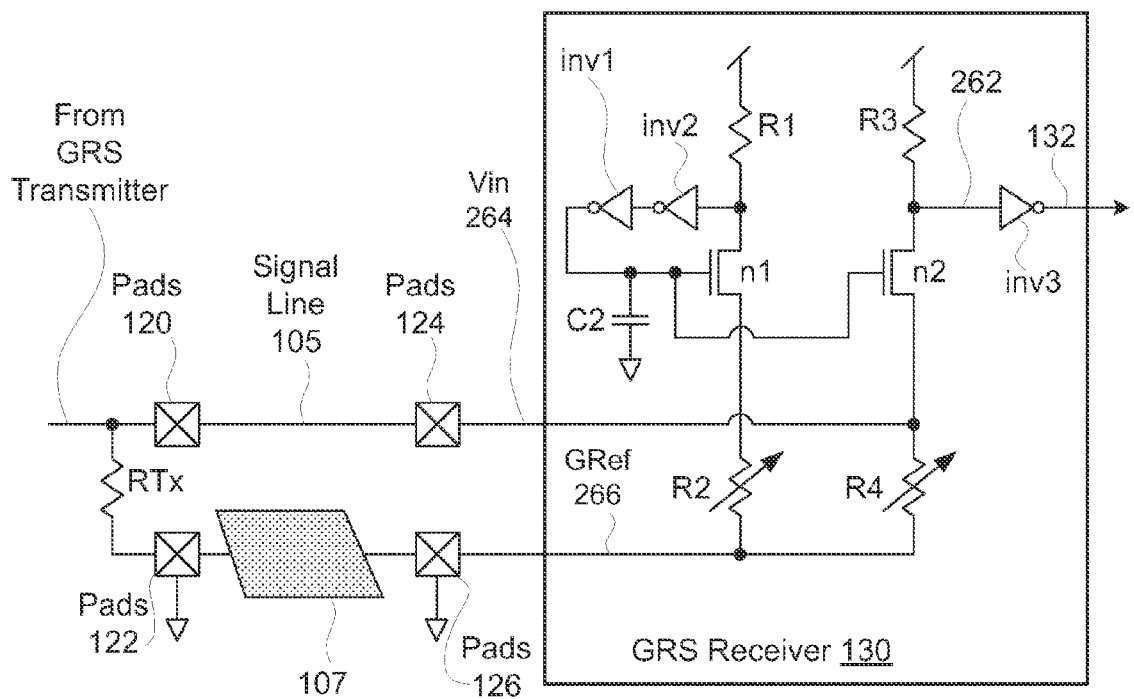
FIG. 2A illustrates an exemplary ground-referenced single-ended receiver, in accordance with one embodiment.

FIG. 2A illustrates an exemplary GRS receiver 130, in accordance with one embodiment. As shown, GRS receiver 130 receives input signals Vin 264 and GRef 266, and generates amplifier output signal 132. In one embodiment, an arriving pulse at Vin 264 having a positive voltage with respect to GRef 266 represents a logical "1" and an arriving pulse at Vin 264 having a negative voltage with respect to GRef 266 represents a logical "0". GRS receiver 130 amplifies a differential voltage between input signals Vin 264 and GRef 266 to generate a corresponding difference signal 262. In one embodiment, GRS receiver 130 is designed to bias difference signal 262 to be centered about a switching threshold for inverter inv3, which amplifies difference signal 262 to generate amplifier output signal 132 according to conventional logic voltage levels.

In one embodiment, GRS receiver 130 comprises resistors R1 through R4, inverters inv1 through inv3, capacitor C2, and field-effect transistors n1 and n2. Resistors R2 and R4 may be implemented as variable resistors, using any technically feasible technique. One exemplary implementation of a variable resistor provides digital control of a resistance value and comprises a set of n-channel FETs connected in a parallel configuration. Each n-channel FET is controlled by a different digital control signal from a control word used to establish the resistance value. If the control word is defined to be a binary number, a corresponding resistance value for the set of n-channel FETs may be monotonic if the n-channel FETs are sized appropriately. In a practical implementation, resistors R2 and R4 are tuned to balance the termination of incoming pulses and current injected into Vin 264 and GRef 266 by GRS receiver 130. A monotonic mapping from a binary code word to a resistance value simplifies any required digital trimming needed to achieve balanced termination. Any technically feasible technique may be implemented to adjust resistors R2 and R4 to achieve balanced termination.

Resistors R1 and R3 may also be implemented using any technically feasible technique. For example, resistors R1 and R3 may be implemented as p-channel FETs that are biased appropriately. Inverters inv1 and inv2 provide gain, while capacitor C2 serves to stabilize a loop formed by inverters inv1 and inv2, in conjunction with resistor R1 and FET n1.

Figure 2B:
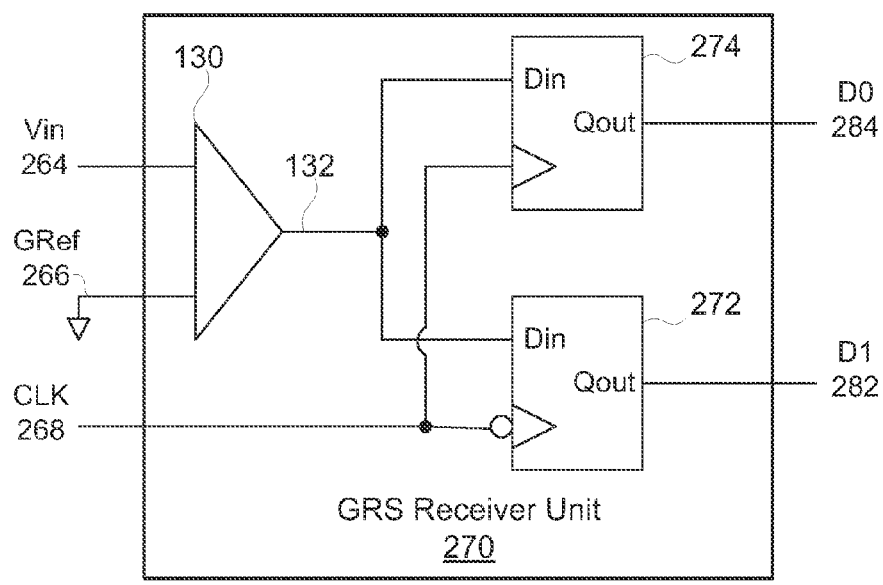
FIG. 2B illustrates an exemplary ground-referenced single-ended receiver, configured to demultiplex incoming data, in accordance with one embodiment.

FIG. 2B illustrates an exemplary GRS receiver unit 270, configured to demultiplex incoming data, in accordance with one embodiment. GRS receiver unit 270 comprises a GRS receiver 130, and storage elements configured to capture and store the logic state of amplifier output signal 132 on alternating clock phases to demultiplex input data represented as arriving pulses on input signal Vin 264, referenced to input signal GRef 266. Each output signal D0 284 and D1 282 presents captured input data at half the frequency of the arriving data pulses.

In one embodiment, the storage elements comprise a positive edge triggered flip-flop 274 and a negative edge triggered flip-flop 272. As shown, positive edge triggered flip-flop 274 is configured to capture D0 during the rising edge of a clock signal CLK 268, while negative edge triggered flip-flop 272 is configured to capture D1 during a falling edge of CLK 268. Such a configuration assumes that CLK 268 and amplifier output signal 132 transition together and that flip-flops 272 and 274 require more setup time than hold time. In alternative embodiments, D0 is captured on a falling edge of CLK 268, while D1 is captured on a rising edge of CLK 268. In other alternative embodiments, the storage elements comprise level-sensitive latches rather than flip-flops.

Figure 3:
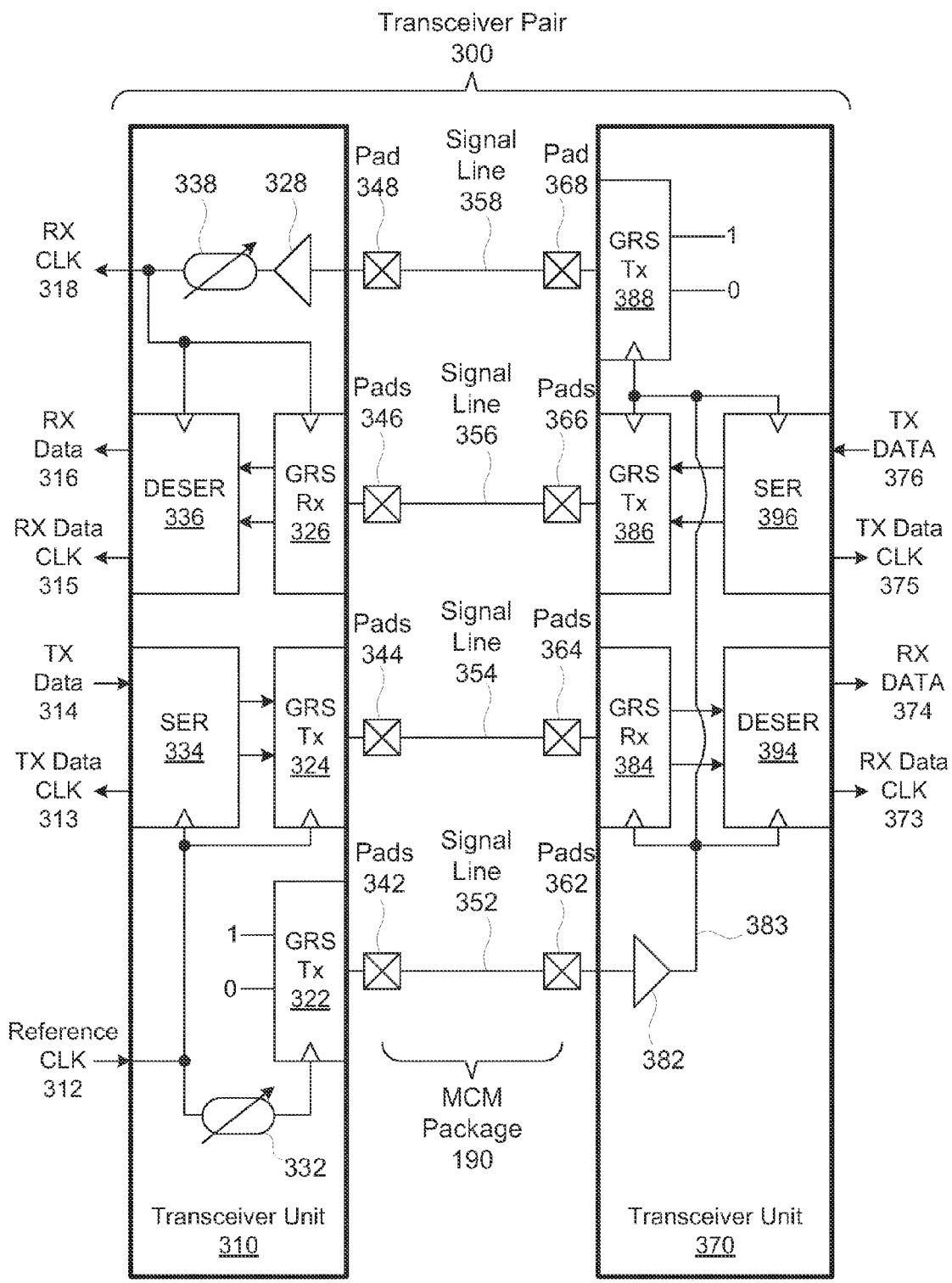
FIG. 3 illustrates an exemplary transceiver pair, configured to implement ground-referenced single-ended signaling, in accordance with one embodiment.

FIG. 3 illustrates an exemplary transceiver pair 300, configured to implement GRS signaling, in accordance with one embodiment. As shown, the transceiver pair 300 includes transceiver unit 310 coupled to transceiver unit 370 through signal lines 352, 354, 356, and 358. Signal lines 352, 354, 356, and 358 may be manufactured as controlled-impedance traces embedded within an MCM package 190. Transceiver 310 is configured to receive a reference clock 312 operating at one half the data transmission rate for the signal lines. Adjustable phase delay 332 may introduce an adjustable phase delay prior to transmitting reference clock 312 to GRS transmitter 322, GRS transmitter 324, and serializer 334.

As shown, the GRS transmitter 322 is configured to transmit a sequential "01" pattern to the GRS receiver 382 through pads 342, signal line 352, and pads 362. In one embodiment, this "01" pattern is transmitted at substantially the same phase as data transmitted from the GRS transmitter 324 to GRS receiver 384 through pads 344, signal line 354, and pads 364. Serializer 334 receives transmit data 314 at a lower frequency than reference clock 312, but at a correspondingly wider parallel width. For example, if reference clock 312 is configured to operate at 10 GHz, and serializer 334 is configured to multiplex a sixteen bit word into two bits for transmission through GRS transmitter 324, then sixteen bit words may arrive at a rate of 10 GHz divided by eight or 1.25 GHz. Here, a transmission data clock 313 may be generated by serializer 334 to operate at 1.25 GHz for timing transfers of arriving transmit data 314. In this example, reference clock 312 has a 100 pS period and each distinct bit transmitted by GRS transmitters 322 and 324 has a unit interval of 50 pS.

GRS receiver 382 receives a phase-delayed version of reference clock 312 through signal line 352 and generates a local reference clock 383, which may be coupled to GRS receiver 384 for capturing arriving pulses on signal line 354. Local reference clock 383 may also be coupled to deserializer 394 for capturing and demultiplexing data from GRS receiver 384. Extending the above example, GRS receiver 384 may capture arriving pulses on alternating clock phases of local reference clock 383, operating at 10 GHz, to generate two bits every 100 pS. Deserializer 394 is configured to demultiplex sequential data comprising two bits from GRS receiver 384 and to generate corresponding sixteen-bit words at a rate of 1.25 GHz. The sixteen-bit words are presented as receive data 374. Deserializer 394 may generate receiver data clock 373 to reflect appropriate clocking for receive data 374. Receive data 374 represents a local copy of transmit data 314. In one embodiment, deserializer 394 is configured to align arriving data along word boundaries. Persons skilled in the art will understand that serialization and deserialization of parallel data may require alignment of the parallel data along word boundaries and that well-known techniques in the art may be implemented by transceiver unit 370 or associated logic without departing the scope and spirit of embodiments of the present invention.

Serializer 396 captures arriving transmit data 376 and serializes the data for transmission by GRS transmitter 386 through signal line 356. In one embodiment, serializer 396 generates transmit data clock 375 based on local reference clock 383 as a clocking reference for arriving transmit data 376. GRS receiver 326 captures the data arriving from signal line 356 and deserializer 336 demultiplexes the data into words, presented as receive data 316. GRS transmitter 388 is configured to transmit a sequential "01" pattern to GRS receiver 328 through pads 368, signal line 358, and pads 348. In one embodiment, this "01" pattern is transmitted at substantially the same phase as data transmitted from GRS transmitter 386 to GRS receiver 326 through pads 366, signal line 356, and pads 346. GRS receiver 328 and adjustable phase delay 338 generate receive clock 318 based on the sequential "01" pattern. In one embodiment, receive data clock 315 is generated by deserializer 336 to reflect appropriate clocking for receive data 316.

Determining a proper phase delay value for adjustable phase delay 332 and adjustable phase delay 338 may be performed using any technically feasible technique. For example, phase delay values for adjustable phase delay 332 and adjustable phase delay 338 may be swept over a range of phase delay values during a link training phase, whereby phase delays corresponding to a substantially minimum bit error rate during training are determined and used for normal link operation.

Although an isochronous clocking model is illustrated herein for transmitting data between transceiver unit 310 and transceiver unit 370, any technically feasible clocking model may be implemented without departing the scope and spirit of embodiments of the present invention.

Figure 4A:
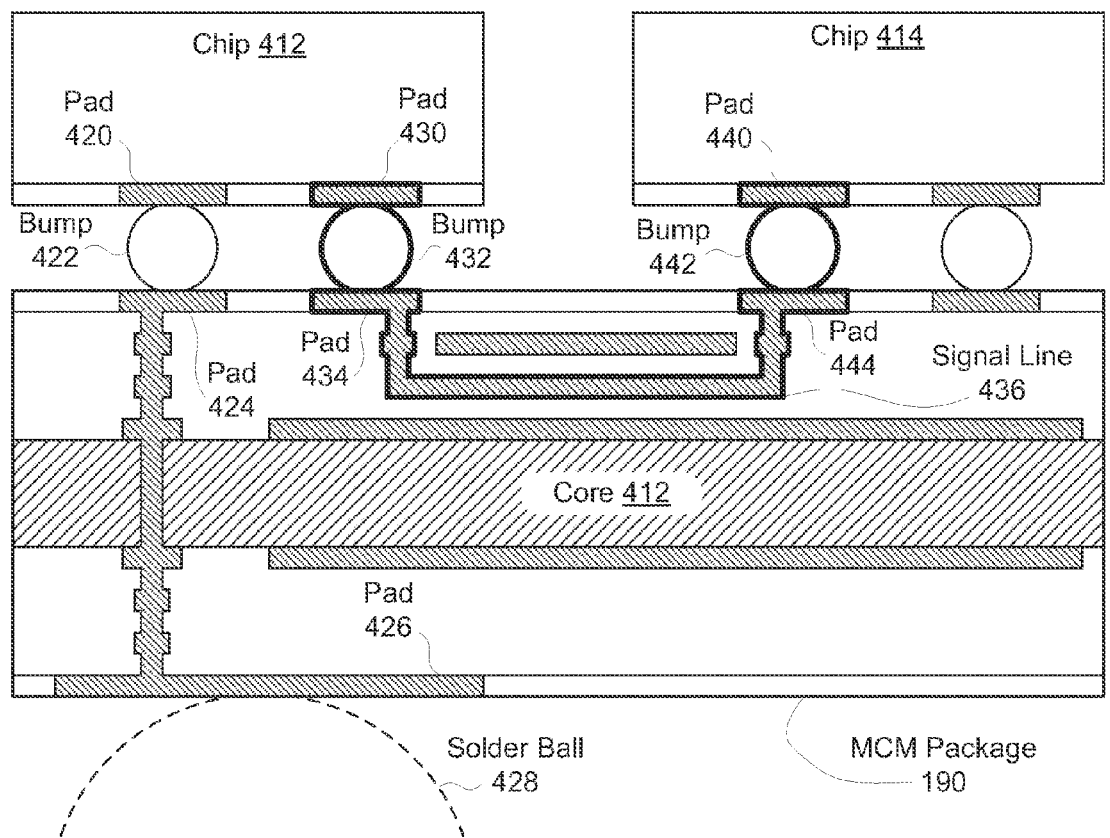
FIG. 4A illustrates a cross-section of a multi-chip module package, configured to interconnect two chips through a signal line, in accordance with one embodiment.

FIG. 4A illustrates a cross-section of MCM package 190, configured to interconnect chip 412 and chip 414 through a signal line 436, in accordance with one embodiment. As shown, chip 412 is coupled to MCM package 190 through at least bond pads 420 and 430, chip connection bumps 422 and 432, and bond pads 424 and 434. Similarly, chip 414 is coupled to MCM package 190 through at least bond pad 440, chip connection bump 442, and bond pad 444. In one embodiment, pad 430, pad 434, and bump 432 comprise pads 120 of FIG. 1A. Furthermore, pad 440, pad 444, and bump 442 comprise pads 124, and signal line 436 comprises signal line 105. An on-chip signal within chip 412 may be routed for external connection to a printed circuit board (not shown) through pad 420, bump 422, pad 424, and pad 426. Pad 426 is coupled to solder ball 428, which is configured to electrically and mechanically couple pad 426 to a bonding pad on the circuit board. MCM package 190 may include a structural and dielectric core 412.

MCM package 190 may be fabricated from any technically feasible materials, including, without limitation, organic fibers, organic polymers, organic laminates, composites, epoxy substrates, epoxy adhesives, ceramics, plastics, silicon or a semiconducting crystalline compound, or any combination or composite thereof. In one embodiment, different interconnection layers comprising MCM package 190 are fabricated separately and laminated together. In one embodiment, signal line 436 is fabricated as an impedance-controlled trace within MCM package 190. In certain implementations, signal line 436 is fabricated as an impedance-controlled strip line.

Figure 4B:
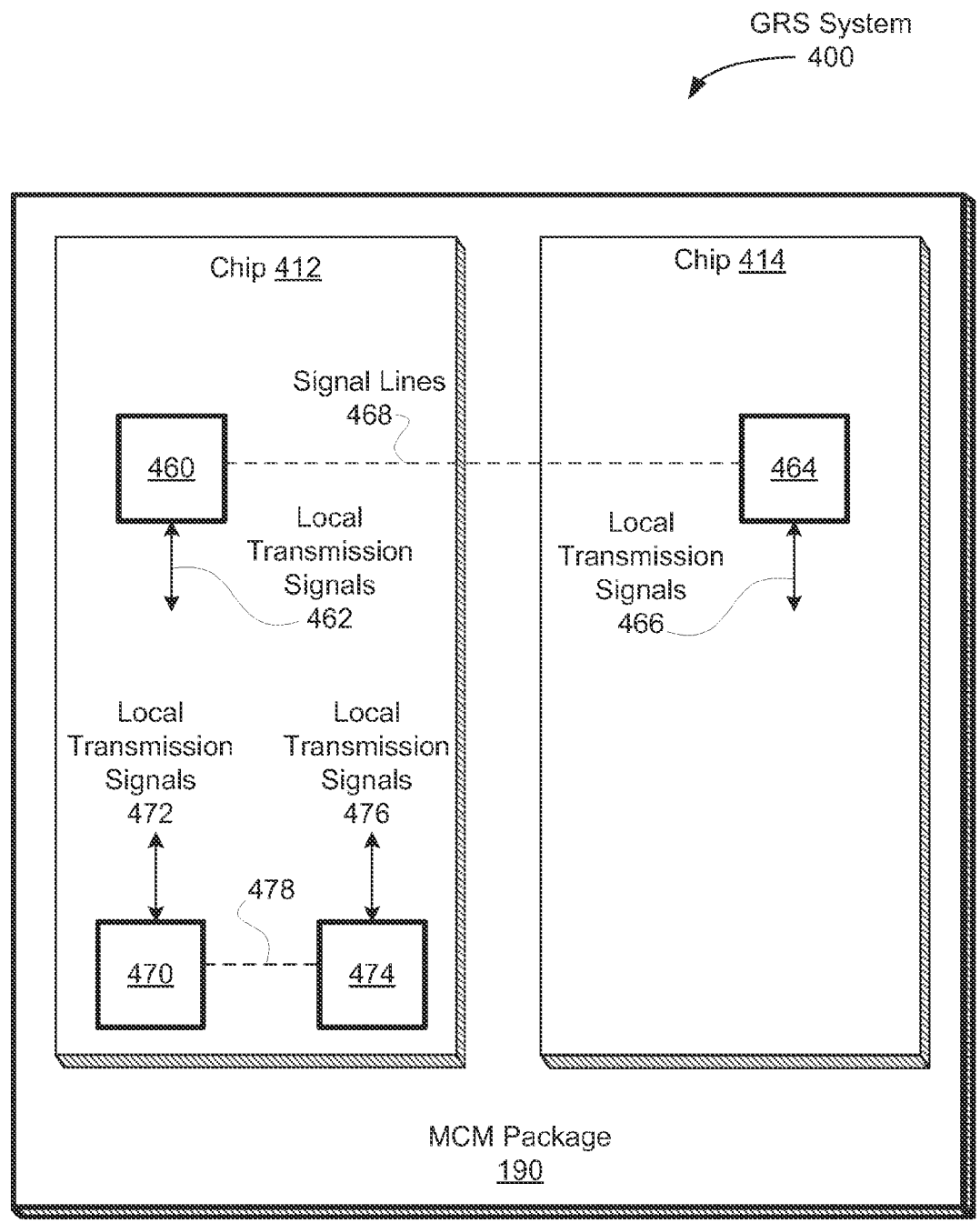
FIG. 4B illustrates a ground-referenced single-ended signaling system, configured to transmit data through signal lines embedded within a multi-chip module package, in accordance with one embodiment.

FIG. 4B illustrates a GRS system 400, configured to transmit data through signal lines 468 fabricated within MCM package 190 of FIG. 3, in accordance with one embodiment. As shown, GRS transceiver 460 is coupled to GRS transceiver 464 through signal lines 468. In one embodiment, GRS transceiver 460 comprises an instance of GRS transceiver 310, and GRS transceiver 464 comprises an instance of GRS transceiver 370. In such an embodiment, local transmission signals 462 comprise at least transmit data 314, receive data 316, and reference clock 312 and local transmission signals 466 comprise at least receive data 374 and transmit data 376. Transmission between GRS transceiver 460 and GRS transceiver 464 illustrates inter-chip communication through MCM package 190. In certain scenarios, intra-chip communication is facilitated by GRS signaling. As shown, GRS transceiver 470 is coupled to GRS transceiver 474 through signal lines 478 to provide intra-chip communication within chip 412. In one embodiment, GRS transceiver 470 comprises an instance of GRS transceiver 310, and GRS transceiver 474 comprises an instance of GRS transceiver 370.

In alternative embodiments, GRS transceiver 460 and GRS transceiver 464 may comprise different combinations of one or more GRS transmitter, such as GRS transmitter 110, and one or more GRS receivers, such as GRS receiver 130. For example, GRS transceiver 460 may implement an arbitrary number of GRS transmitters for transmitting data, or an arbitrary number of data drivers within a given GRS transmitter for generating pulses that encode data.

Embodiments of the present invention provide reduced average access latency to certain memory circuits by interconnecting the memory circuits to one or more clients through in-package signal lines, such as signal line 436 of FIG. 4A within MCM package 190 of FIGS. 1A-4B. As is known in the art, typical on-chip propagation velocity for a wire with spaced repeaters is characterized as being approximately 1.4 µm/ps. By contrast, typical package-level propagation velocity, such as provided by signal line 436, may be approximately 150 µm/ps, which represents a propagation velocity advantage of two orders of magnitude compared to on-chip signal lines. This difference in propagation velocity enables in-package signal lines to advantageously provide lower access latency to memory circuits disposed at increasing physical distances from clients, such as processor cores. For example, in a typical processor system chip, each processing core may require traces that are 20 mm to 30 mm in length, resulting in a round-trip access latency of at least 28-41 ns using on-chip interconnects. If each processor is operating at 1.25 GHz, this access latency represents approximately 30 to 50 cycles, without counting additional cycles needed by a target memory circuit. By contrast, in-package signaling may provide a round-trip time-of-flight latency of less than 1.0 ns. Data serialization may also be implemented to reduce in-package signal counts, leading to additional latency, but less than 1.0 ns for a 32-bit word of data.

In one embodiment, one or more processing cores are coupled to one or more memory circuits that are configured to operate as cache memory for the processing cores. Different interconnection topologies for the processing cores and memory circuits are illustrated below in FIGS. 5A through 5E. In one embodiment, the cache memory comprises static random access memory (SRAM).

Figure 5A:
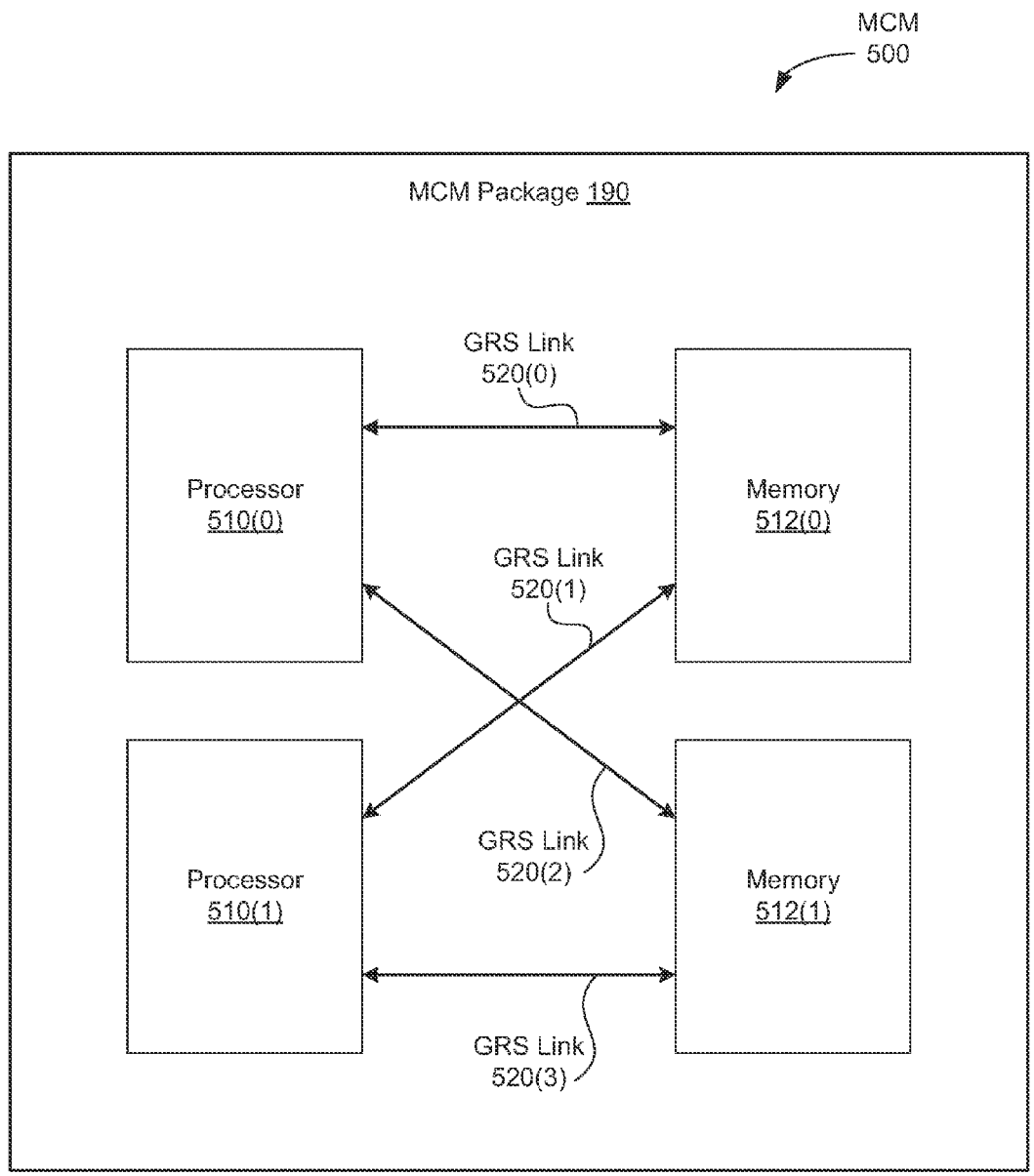
FIG. 5A illustrates a multi-chip module comprising two processors interconnected with two memory circuits to form a point-to-point topology, in accordance with one embodiment.

FIG. 5A illustrates a multi-chip module 500 comprising two processors 510 interconnected with two memory circuits 512 to form a point-to-point topology, in accordance with one embodiment. Memory circuits 512 implement cache memory, which may be shared by processors 510. Memory circuits 512 are coupled to processors 510 through GRS links 520. MCM package 190 provides signal lines, such as signal line 436 of FIG. 4A, comprising GRS links 520.

As shown, processor 510(0) is coupled to memory circuit 512(0) through GRS link 520(0) and to memory circuit 512(1) through GRS link 520(2). Similarly, processor 510(1) is coupled to memory circuit 512(0) through GRS link 520(1)

and to memory circuit 512(1) through GRS link 520(3). This configuration represents a point-to-point topology as each client processor 510 has a direct link to each memory circuit 512. Processors 510 are coupled to associated GRS links 520 through corresponding GRS transceivers (not shown), such as instances of transceiver unit 310 of FIG. 3. These GRS transceivers are integrated within corresponding processors 510. Similarly, memory circuits 512 are coupled to associated GRS links 520 through corresponding GRS transceivers (not shown), such as instances of transceiver unit 370. These GRS transceivers are integrated within corresponding memory circuits 512.

In one embodiment, processors 510 and memory circuits 512 are fabricated within the same chip, coupled to MCM package 190. In other embodiments, processors 510(0) and 510(1) are independently fabricated chips coupled to MCM package 190. In certain other embodiments, memory circuits 512(0) and 512(1) are also independently fabricated chips coupled to MCM package 190.

In certain embodiments, processors 510 are configured to generate split transactions, and memory circuits 512 are configured to respond to the split transactions. A split transaction communication regime enables multiple cores within processors 510 to generate and post multiple requests, which may remain outstanding while other requests are processed by memory circuits 512.

Figure 5B:
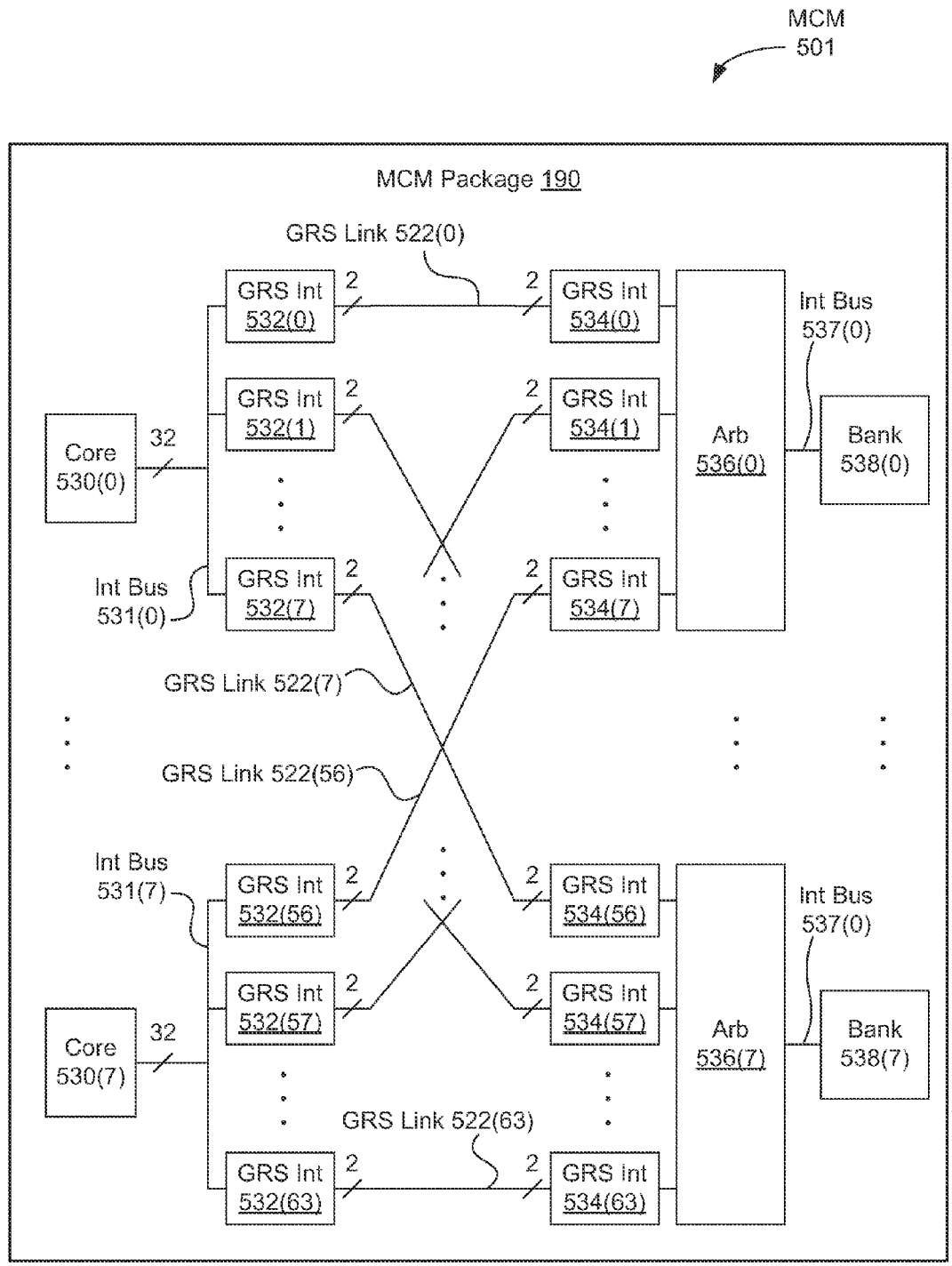
FIG. 5B illustrates a multi-chip module comprising two or more processor cores and two or more memory banks interconnected to a form a point-to-point topology, in accordance with one embodiment.

FIG. 5B illustrates a multi-chip module 501 comprising two or more processor cores 530 and two or more memory banks 538 interconnected to a form a point-to-point topology, in accordance with one embodiment. As shown, each core 530 is coupled to each memory bank 538 through an interconnection path comprising a GRS interface circuit 532, a corresponding GRS interface circuit 534, and an associated arbitration unit 536. In one embodiment, memory bank 538 implements a bank of cache memory.

Each core 530 may comprise one or more instance of a general-purpose central processing unit (CPU) or one or more instance of a graphics processing unit (GPU). Each core is coupled to a set of GRS interface circuits 534 through an interface bus 531. Each GRS interface circuit 532 is coupled to a corresponding GRS interface circuit 534 through an associated GRS link 522. Each GRS link 522 comprises signal lines, such as signal line 436 of FIG. 4A, embedded within MCM package 190. An arbiter 536 is coupled to GRS interface circuits 534 associated with a particular memory bank 538. Arbitration unit 536 is configured to select among access requests received from GRS interface circuits 534 and schedule the requests for processing by memory bank 538. Arbitration unit 536 posts a selected request to memory bank 538, and completes a transaction for the selected request by posting an acknowledgement through an appropriate GRS interface circuit 534. Arbitration unit 536 is coupled to memory bank 538 through interface bus 537.

In one embodiment, interface bus 531 and interface bus 537 implement conventional logic levels, while GRS links 522 implement GRS signaling, described previously. Outbound data from core 530 on interface bus 531 is serialized for transmission over a GRS link 522, while inbound data on GRS link 522 is deserialized for transmission to core 530 through interface bus 531. Serialized data arriving at GRS interface circuit 534 is deserialized for processing by arbitration unit 536. Arbitration unit 536 is configured to transmit deserialized data comprising an access request to a corresponding memory bank 538 through interface bus 537. Arbitration unit 536 is also configured to transmit reply data from the corresponding memory bank 538 back to a core 530 that originated an associated access request. In one embodiment, each GRS interface circuit 532 implements an instance of transceiver unit 310 of FIG. 3, and each GRS interface circuit 534 implements an instance of transceiver unit 370.

In one embodiment, cores 530 and associated GRS interface circuits 532 are fabricated on the same chip. In certain embodiments, memory banks 538, arbitration units 536 and associated interface circuits 534 are fabricated on the same chip with cores 530. In such embodiments, GRS links 522 provide lower access latency between cores 530 and memory banks 538. In other embodiments, memory banks 538, arbitration units 536 and associated interface circuits 534 are fabricated on a second, different chip from cores 530. In such embodiments, GRS links 522 provide lower access latency between cores 530 and memory banks 538. Additionally, each chip may be smaller than a chip comprising both cores and memory banks. In still other embodiments, a cache memory unit comprising a memory bank 538, an associated arbitration unit 536, and associated GRS interface circuits 534 is fabricated on an independent chip. In certain embodiments, one or more cores 530 are fabricated on an independent chip, and one or more cache memory units are fabricated on an independent chip. In each of the above embodiments, each independent chip is coupled to MCM package 190.

In certain embodiments, cores 530 are configured to generate split transactions, and arbitration units 536 are configured to respond to the split transactions. A split transaction communication regime enables multiple thread processors within cores 530 to generate and post multiple requests, which may remain outstanding while other requests are processed by arbitration units 536 and memory banks 538.

Figure 5C:
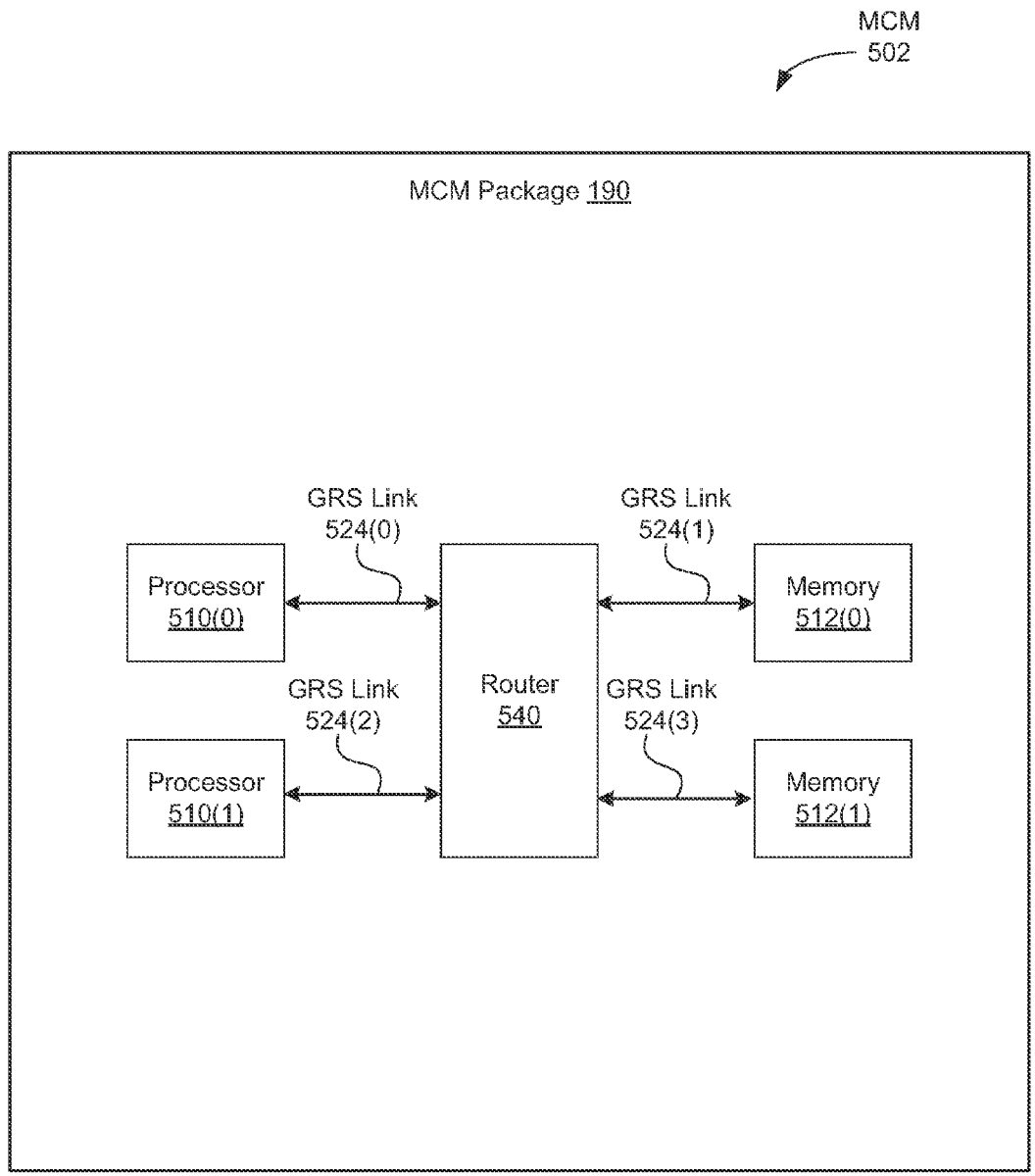
FIG. 5C illustrates a multi-chip module comprising two processors interconnected with two memory circuits through a router circuit, in accordance with one embodiment.

FIG. 5C illustrates a multi-chip module 502 comprising two processors 510 interconnected with two memory circuits 512 through a router circuit 540, in accordance with one embodiment. Memory circuits 512 implement cache memory, which may be shared among processors 510. Memory circuits 512 and processors 510 are coupled to router circuit 540 through GRS links 524. Router circuit 540 routes communication between processors 510 and memory circuits 512.

Two processors 510 and two memory circuits 512 are shown herein for illustrative purposes; however, persons of ordinary still in the art will recognize that an arbitrary number of processors and an arbitrary number of memory circuits may be implemented without departing the scope and spirit of embodiments of the present invention.

MCM package 190 provides signal lines, such as signal line 436 of FIG. 4A, comprising GRS links 524. As shown, processor 510(0) is coupled to router circuit 540 through GRS link 524(0) and processor 510(1) is coupled to router circuit 540 through GRS link 524(2). Memory circuit 512(0) is coupled to router circuit 540 through GRS link 524(1) and memory circuit 512(1) is coupled to router circuit 540 through GRS link 524(3). Router 540 receives access requests from processors 510 and transmits each access request to an appropriate memory circuit 512. When the memory circuit 512 generates a reply to a given access request, router 540 transmits the reply back to a processor that originated the access request.

Processors 510 are coupled to associated GRS links 520 through corresponding GRS transceivers (not shown), such as instances of transceiver unit 310 of FIG. 3. These GRS transceivers are integrated within corresponding processors 510. Similarly, memory circuits 512 are coupled to associated GRS links 520 through corresponding GRS transceivers (not shown), such as instances of transceiver unit 370. These GRS transceivers are integrated within corresponding memory circuits 512.

In one embodiment, processors 510, router circuit 540, and memory circuits 512 are fabricated within the same chip and coupled to MCM package 190. GRS links 524 comprise traces within MCM package 190. In other embodiments, processors 510(0) and 510(1) are independently fabricated chips coupled to MCM package 190. In certain other embodiments, memory circuits 512(0) and 512(1) are also independently fabricated chips coupled to MCM package 190. In yet other embodiments, router circuit 540 is an independently fabricated chip coupled to MCM package 190.

In certain embodiments, processors 510 are configured to generate split transactions, and memory circuits 512 are configured to respond to the split transactions. A split transaction communication regime enables multiple cores within processors 510 to generate and post multiple requests, which may remain outstanding while other requests are processed by memory circuits 512.

Figure 5D:
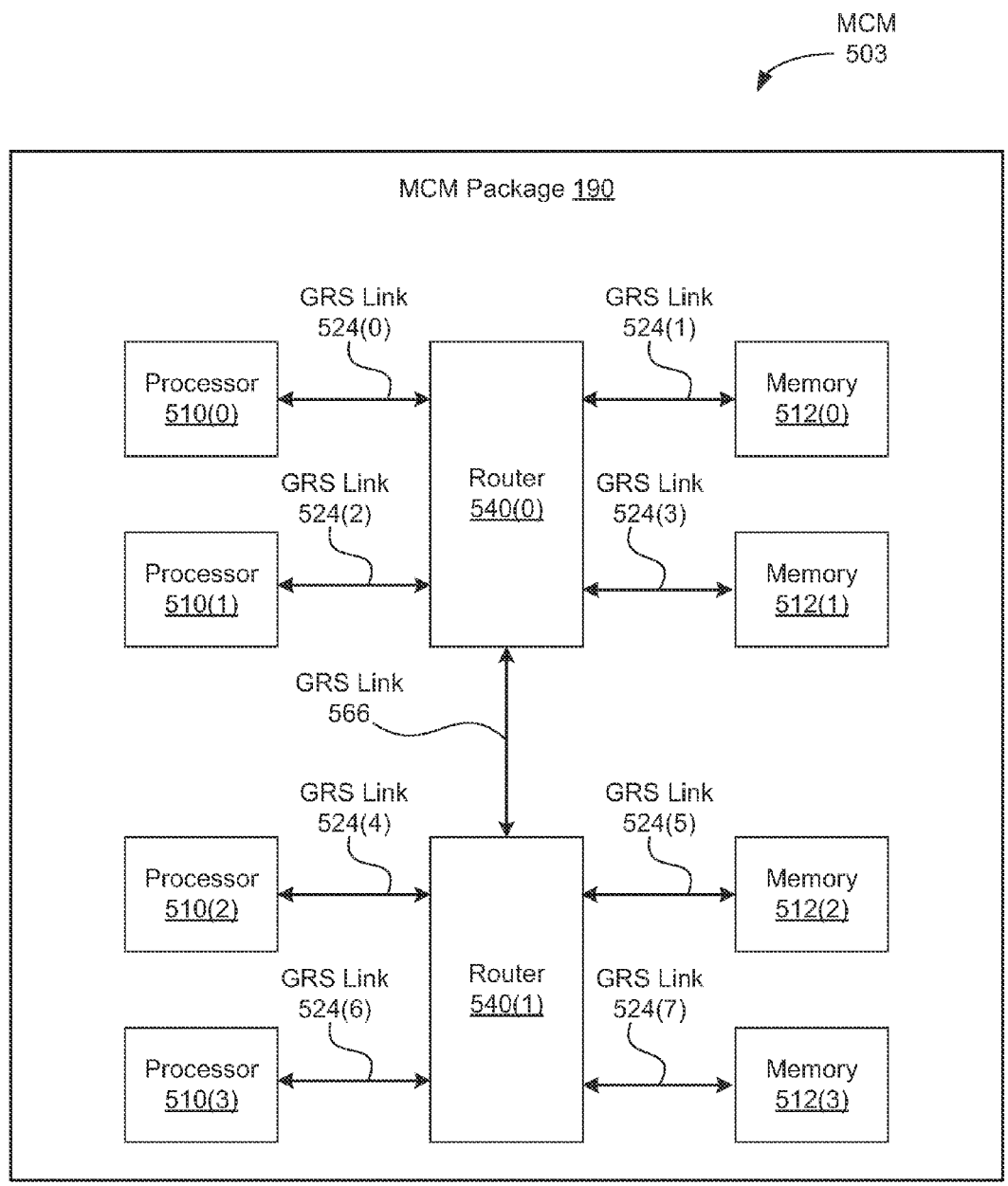
FIG. 5D illustrates a multi-chip module comprising four processors interconnected with four memory circuits through a network of two router circuits, in accordance with one embodiment.

FIG. 5D illustrates a multi-chip module 503 comprising four processors 510 interconnected with four memory circuits 512 through a network of two router circuits 540, in accordance with one embodiment. Memory circuits 512 implement cache memory, which may be shared among processors 510. Memory circuits 512 and processors 510 are coupled to router circuits 540 through GRS links 524. Router circuit 540(0) is coupled to router circuit 540(1) through GRS link 566. Each router circuit 540 may route communication between directly attached processors 510 and directly attached memory circuits 512. Each router circuit 540 may also route communication between directly attached processors 510 and remotely attached memory circuits 512 through a second router circuit 540. For example, communication between processor 510(0) and memory circuit 512(3) is routed through router 540(0) and router 540(1).

Four processors 510, four memory circuits 512, and two routers 540 are shown herein for illustrative purposes: however, persons of ordinary still in the art will recognize that an arbitrary number of processors and an arbitrary number of memory circuits may be implemented without departing the scope and spirit of embodiments of the present invention. For example, a multi-hop network comprising a plurality of routers 540 may be implemented to interconnect a large number of processors 510 to a large number of memory circuits 512. In other embodiments, a plurality of routers 540 is configured in a topology including, but not limited to a mesh, a torus, a fat-tree, a flattened butterfly, etc.

MCM package 190 provides signal lines, such as signal line 436 of FIG. 4A, comprising GRS links 524. As shown, processor 510(0) is coupled to router circuit 540(0) through GRS link 524(0) and processor 510(1) is coupled to router circuit 540 through GRS link 524(2). Memory circuit 512(0) is coupled to router circuit 540(0) through GRS link 524(1) and memory circuit 512(1) is coupled to router circuit 540(0) through GRS link 524(3). Similarly, processor 510(2) is coupled to router circuit 540(1) through GRS link 524(4) and processor 510(3) is coupled to router circuit 540(1) through GRS link 524(6). Memory circuit 512(2) is coupled to router circuit 540(1) through GRS link 524(5) and memory circuit 512(3) is coupled to router circuit 540 through GRS link 524(7).

Router 540(0) is configured to receive access requests from processors 510(0)-510(1) and transmit each access request to a target memory circuit 512. If the target memory circuit for a given access request is locally attached to router 540(0), such as memory circuits 512(0)-512(1), then router 540(0) transmits the access request to the target memory circuit. Otherwise, router 540(0) transmits the access request to router circuit 540(1). In general, an access request may be routed to a router circuit along an interconnection path associated with the target memory circuit. In this example, router 540(0) transmits the access request to router circuit 540(1).

When the target memory circuit 512 generates a reply to a given access request, the reply is transmitted back to a processor that originated the access request. In one embodiment, a reply to an access request follows an inverse path corresponding to an initial path associated with the access request.

Processors 510 are coupled to associated GRS links 524 through corresponding GRS transceivers (not shown), such as instances of transceiver unit 310 of FIG. 3. These GRS transceivers are integrated within corresponding processors 510. Similarly, memory circuits 512 are coupled to associated GRS links 524 through corresponding GRS transceivers (not shown), such as instances of transceiver unit 370. These GRS transceivers are integrated within corresponding memory circuits 512.

In one embodiment, processors 510, router circuits 540, and memory circuits 512 are fabricated within the same chip and coupled to MCM package 190. GRS links 524 comprise traces within MCM package 190. In other embodiments, processors 510(0) and 510(1) are independently fabricated chips coupled to MCM package 190. In certain other embodiments, memory circuits 512(0) and 512(1) are also independently fabricated chips coupled to MCM package 190. In yet other embodiments, router circuits 540 are one or more independently fabricated chips that are coupled to MCM package 190. In certain embodiments, processors 510 are configured to generate split transactions, and memory circuits 512 are configured to respond to the split transactions.

Figure 5E:
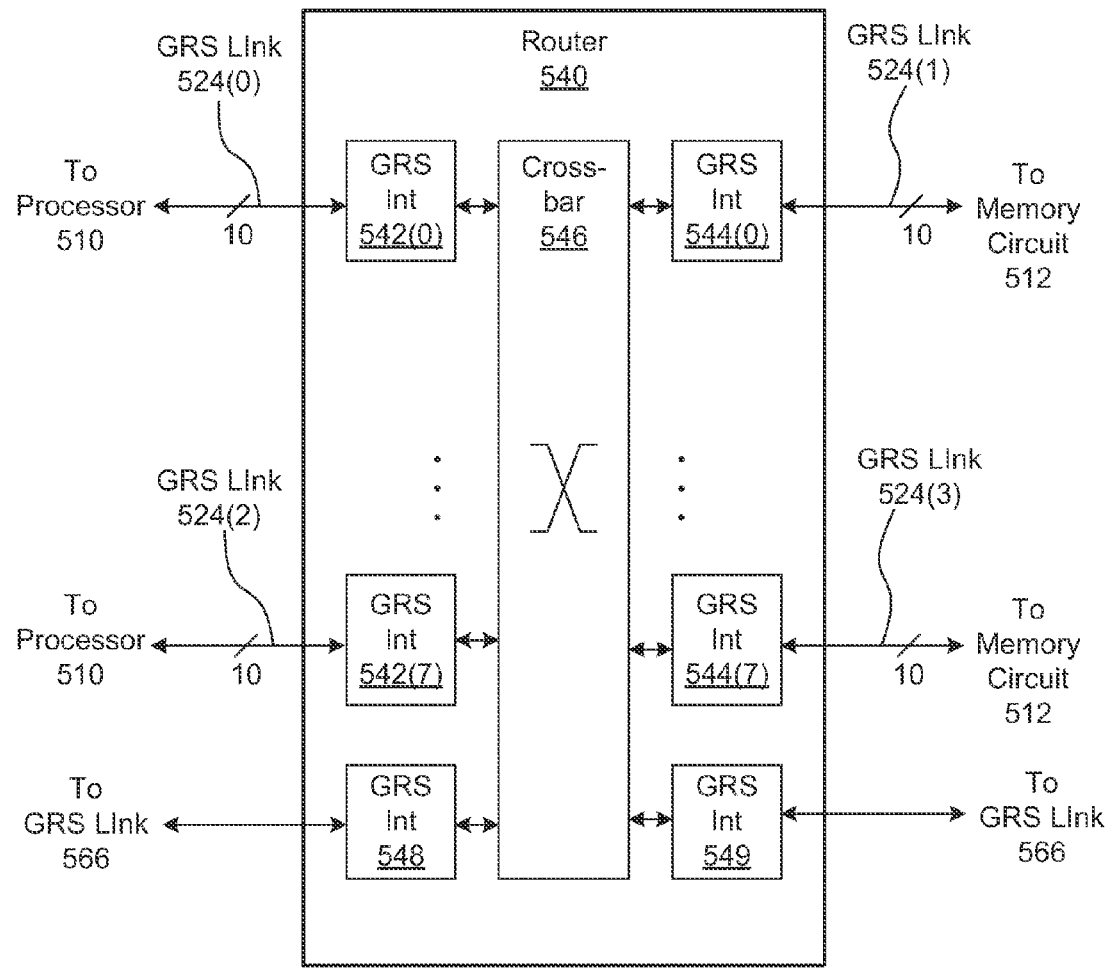
FIG. 5E illustrates a router circuit in greater detail, in accordance with one embodiment.

FIG. 5E illustrates a router circuit 540 in greater detail, in accordance with one embodiment. As shown, router circuit 540 includes a set of GRS interface circuits 542 configured to communicate with processors 510 of FIGS. 5C-5D, and a set of GRS interface circuits 544 configured to communicate with memory circuits 512. In one embodiment, GRS interface circuits 542 implement instances of transceiver unit 370 of FIG. 3, and GRS interface circuits 544 implement instances of transceiver unit 310.

In one embodiment, GRS links 524 comprise ten bi-directional signal lines configured to encode a 32-bit address/command field and a 128-bit data field. Transceiver units 310 and 370 may be configured for bi-directional operation by combining signal lines 356 and 354 into one signal line, while implementing any well-known directional flow control protocol. A configuration of transceiver 310 having ten bi-directional signal lines would comprise ten instances of GRS transmitter 324 and ten instances of GRS receiver 326. Similarly, a configuration of transceiver 370 having ten bi-directional signal lines would comprise ten instances of GRS transmitter 386 and ten instances of GRS receiver 384. In an alternative embodiment (not shown) separate unidirectional signal lines can be used for each GRS link.

Crossbar 546 receives inbound requests from one or more GRS interface circuits 542, 544. Each inbound request may require outbound delivery through a GRS interface circuit 542, 544. More than one inbound request may need to access the same outbound GRS interface circuit. In such scenarios, crossbar 546 arbitrates among competing requests and allows one request access to a given GRS interface circuit, while storing other requests in a request queue for subsequent access to the GRS interface circuit. Any technically feasible technique may be implemented for arbitration, queuing, and scheduling among the GRS interface circuits 542, 544 without departing the scope and spirit of embodiments of the present invention. Flow control may be implemented to apply backpressure to the incoming GRS links when the request queues become full.

Figure 5F:
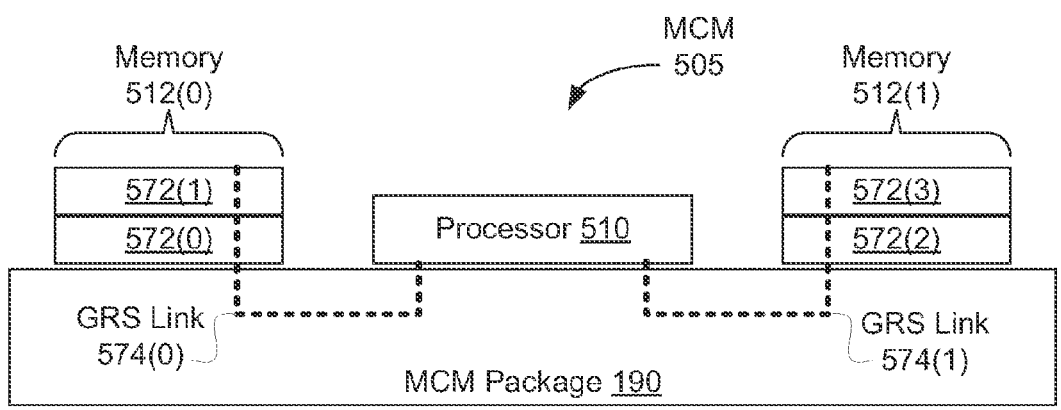
FIG. 5F illustrates a cross-sectional view of a processor within a multi-chip module coupled to memory circuits through a multi-chip module package, in accordance with one embodiment.

FIG. 5F illustrates a cross-sectional view of processor 510 within multi-chip module 500, coupled to at least one memory circuit 512 through multi-chip module package 190, in accordance with one embodiment. As shown, each memory circuit 512 comprises one or more memory chips 572. In one embodiment, memory chips 572 are fabricated to include through-die vias (also known as "through-silicon vias" or simply "silicon vias"). The through-die vias provide electrical connectivity from the bottom surface to the top surface of each memory chip 572, allowing a common electrical connection to be formed along a vertical signal path that may traverse each memory chip 572 in a memory circuit 512. In one embodiment, a GRS link 574 is coupled to each memory chip 572 in a memory circuit 512 along the vertical signal path, providing access to each memory chip 572. Stacking memory chips 572 may provide higher-density cache memory to processor 510 compared to non-stacked configurations.

Figure 5G:
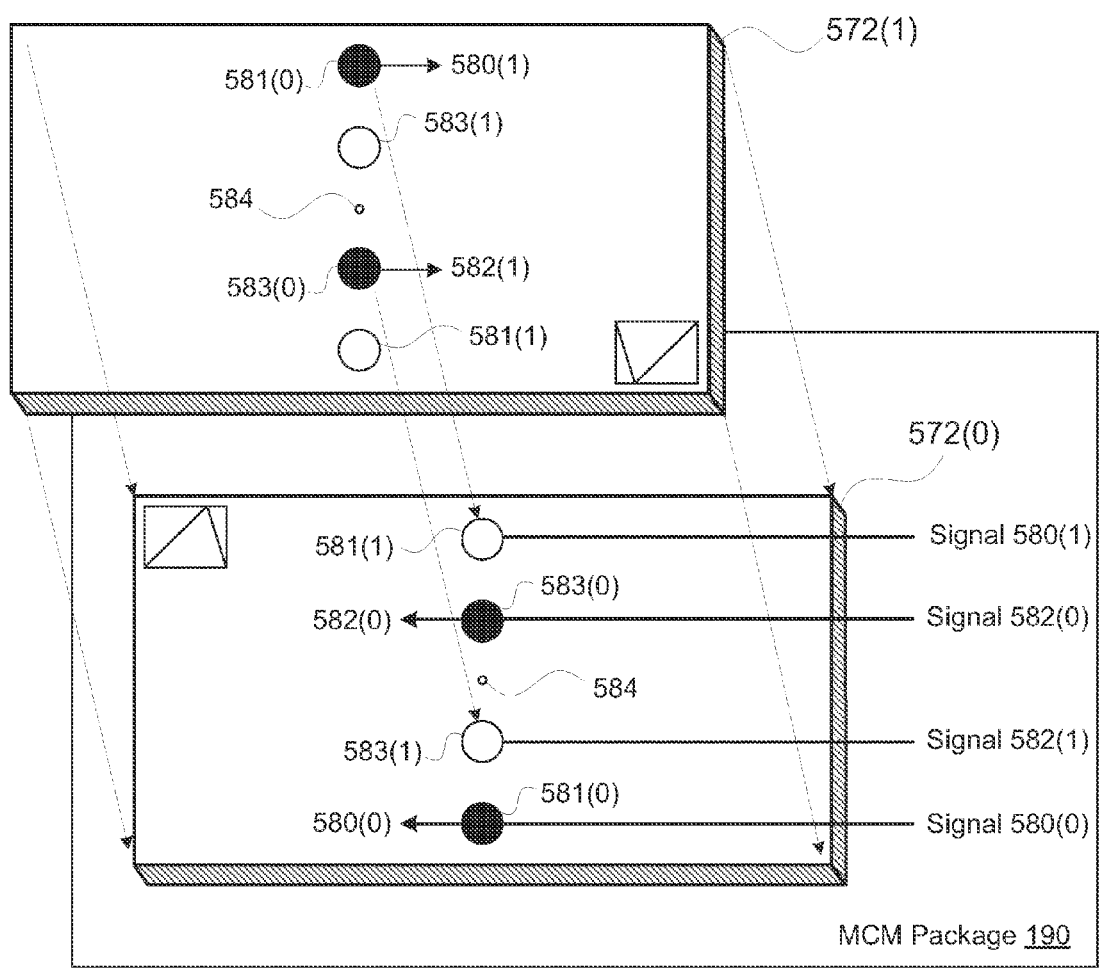
FIG. 5G illustrates an exemplary technique for organizing memory chip signals for stacking, in accordance with one embodiment.

FIG. 5G illustrates an exemplary technique for organizing memory chip signals for stacking, in accordance with one embodiment. As shown, memory chip 572(0) is coupled to MCM package 190 and memory chip 572(1) is coupled to memory chip 572(0) in a vertical stack configuration. Through-die vias 581, 583 provide electrical connections from bonding pads (not shown) on MCM package 190 through memory chip 572(1). Additional memory chips stacked above memory chip 572(1) may be similarly connected. Through-die vias 581, 583 drawn herein as open circles act as pass-through connections and should otherwise not be connected to circuitry on a given memory chip 572, while through-die vias drawn as filled circles are connected to circuitry on the memory chip. As shown, memory chip 572(1) is oriented one-hundred and eighty degrees about a center of rotation 584 with respect to memory chip 572(0). This rotation allows memory chip 572(0) to connect to a different set of signals than memory chip 572(1), while also allowing memory chip 572(0) to pass-through all required signals needed for memory chip 572(1).

As shown, each identical memory chip 572 requires a signal 580 and a signal 582. In the exemplary system configuration shown herein, memory chip 572(0) requires signals 580(0) and 582(0), while memory chip 572(1) requires signals 580(1) and 582(1). Signal 580(0) within MCM package 190 is coupled to circuitry within memory chip 572(0), but passes-through memory chip 572(1). Similarly, signal 580(1) passes through memory chip 572(0) but is coupled to circuitry within memory chip 572(1).

One or more addition pairs of memory chips 572 may be further stacked above memory chip 572(1), whereby the memory chips 572 within each additional pair are oriented according to memory chip 572(0) and 572(1). Each memory chip 572 within an arbitrary pair oriented according to memory chip 572(0) will be coupled to signals 580(0) and 582(0), while each memory chip 572 oriented according to memory chip 572(1) will be coupled to signals 580(1) and 582(1).

The above example illustrates a scenario whereby two signals are distributed from MCM package 190 to each substantially identical memory chip 572(0), 572(1), however persons skilled in the art will understand that the disclosed technique may be applied to an arbitrary number of signals and an arbitrary number of memory chips. More generally, the technique may be applied to provide differentiated signal distribution to any technically feasible stack of chips, each configured to implement an arbitrary function.

In configurations having two or more pairs of stacked chips, each chip may be required to have a unique identification number within the stack in order to properly respond to control commands. Any technically feasible technique may be implemented to establish a unique identification number for each chip, or, alternatively, a unique pair number for each chip. In one embodiment, each memory chip 572 includes a through-die via for receiving an inbound identification signal and a bonding pad for transmitting an outbound identification signal. The bonding pad is configured to align with the through-die via in a one-hundred eighty degree orientation. In this way, memory chip 572(0) may receive an inbound identification signal from MCM package 190, such as from processor 510. Memory chip 572(0) may then transmit an outbound identification signal through the bonding pad, coupled to a through-die via within memory chip 572(1). This identification signal becomes an inbound identification signal within memory chip 572(1). Each chip within an arbitrary stack of chips may be identified using this technique, enabling a command transmitted through a shared physical signal, such as parallel GRS channel 572, to target only an identified target chip.

As described above, each memory chip 572 within a memory circuit 512 may be substantially identical. This represents an advantage over certain prior art stacking solutions that require two or more different versions of a stacked memory chip. Such different versions may include mirrored or "odd" and "even" versions for stacking.

Figure 6:
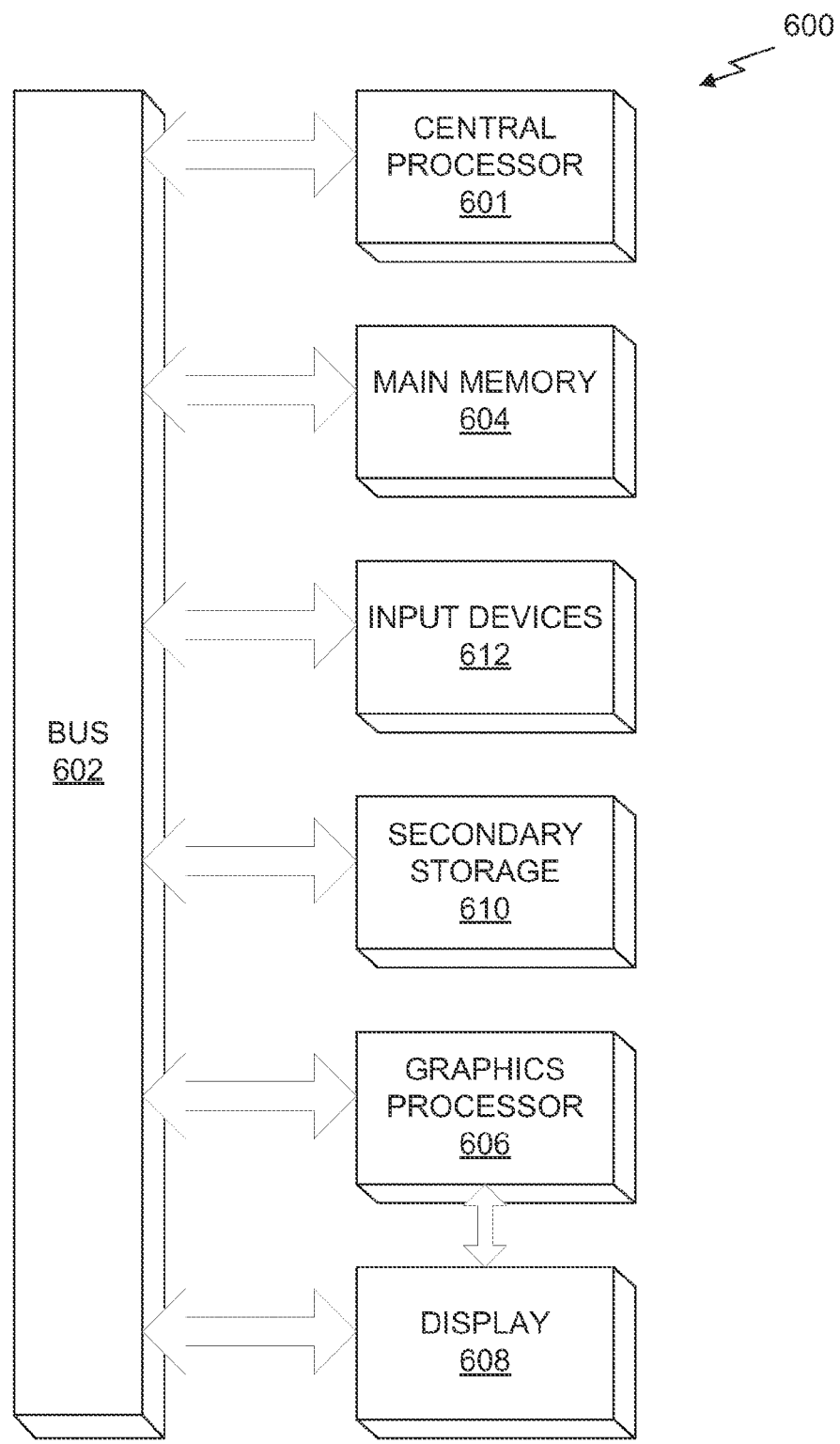
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 604 and/or the secondary storage 610. Such computer programs, when executed, enable the system 600 to perform various functions. The main memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

In one embodiment, certain signals within bus 602 are implemented as GRS signals, as described above in FIGS. 1A-3. In one embodiment, central processor 601 is implemented as processors 510(0)-510(1) of FIG. 5A. In another embodiment, graphics processor 606 is implemented as processors 510(0)-510(1). In yet another embodiment central processor 601, as processor 510(0), and graphics processor 606 a processor 510(1).

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
 a first processing unit comprising a first ground-referenced single-ended signaling (GRS) interface circuit;
 a first cache memory comprising a second GRS interface circuit; and
 a multi-chip module (MCM) package configured to include a ground network and one or more electrical traces that couple the first GRS interface circuit to the second GRS interface circuit,
 wherein the first GRS interface circuit and the second GRS interface circuit are each configured to transmit a pulse along one trace of the one or more electrical traces by discharging a capacitor between the one trace and the ground network, and current associated with transmitting the pulse is locally balanced between the one trace and the ground network.

2. The system of claim 1, wherein a positively charged node on the capacitor is coupled to the one trace and a negatively charged node on the capacitor is coupled to the ground network to generate a pulse representing a logical value of one.

3. The system of claim 1, wherein a negatively charged node on the capacitor is coupled to the one trace and a positively charged node on the capacitor is coupled to the ground network to generate a pulse representing a logical value of zero.

4. The system of claim 1, wherein the first cache memory comprises a stack of memory chips fabricated to include two or more through-die vias.

5. The system of claim 1, wherein the first cache memory comprises a stack of memory chips, and wherein a first memory chip of the stack of memory chips is fabricated to include a first through-die via coupled to circuitry within the first memory chip, and wherein a second through-die via is configured to couple a pass-through signal through the first memory chip, and wherein the first through-die via is disposed in a location that substantially overlaps with the second through-die via when the first memory chip is rotated about a center of rotation by one-hundred and eighty degrees.

6. The system of claim 5, wherein the stack of memory chips further comprises a second memory chip configured to include the second GRS interface circuit, and wherein the second GRS interface circuit is coupled to pass-through signal.

7. The system of claim 1, wherein the first cache memory comprises static random access memory (SRAM).

8. The system of claim 1, wherein the first GRS interface circuit comprises a bidirectional transceiver circuit.

9. The system of claim 8, wherein the bidirectional transceiver circuit is configured to serialize outbound data and deserialize inbound data.

10. The system of claim 1, further comprising a second processing unit comprising a third GRS interface circuit and, wherein the first cache memory further comprises a fourth GRS interface circuit, and the one or more electrical traces couple the third GRS interface circuit to the fourth GRS interface circuit.

11. The system of claim 10, further comprising a second cache memory comprising a fifth GRS interface circuit and a sixth GRS interface circuit, wherein the first processing unit comprises a seventh GRS interface circuit and the second processing unit comprises an eighth GRS interface circuit, and the one or more electrical traces couple the seventh GRS interface circuit to the fifth GRS interface circuit, and the eighth GRS interface circuit to the sixth GRS interface circuit.

12. The system of claim 10, wherein the first processing unit comprises a central processing unit and the second processing unit comprises a graphics processing unit.

13. The system of claim 1, wherein the one or more electrical traces interconnect the first GRS interface circuit to the second GRS interface circuit through a first router circuit.

14. The system of claim 13, wherein the first router circuit is configured to transmit data from an inbound GRS interface circuit to an outbound GRS interface circuit.

15. The system of claim 14, wherein the first router circuit is configured to transmit data to a second router circuit through a third GRS interface circuit.

16. The system of claim 13, further comprising a second cache memory that is coupled to the first router circuit.

17. The system of claim 1, wherein the first cache memory comprises a plurality of banks, and an arbitration circuit that is coupled between a first bank and the second GRS interface circuit.

18. The system of claim 1, wherein the package comprises an organic substrate.

19. The system of claim 1, wherein the package includes a silicon substrate.

* * * * *